(12) United States Patent
Shouji et al.

(10) Patent No.: US 8,809,089 B2
(45) Date of Patent: Aug. 19, 2014

(54) METHOD OF MANUFACTURING SURFACE EMITTING LASER, AND SURFACE EMITTING LASER, SURFACE EMITTING LASER ARRAY, OPTICAL SCANNING DEVICE AND IMAGE FORMING APPARATUS

(71) Applicants: Hiroyoshi Shouji, Miyagi (JP); Shunichi Sato, Miyagi (JP); Akihiro Itoh, Miyagi (JP); Kazuhiro Harasaka, Miyagi (JP)

(72) Inventors: Hiroyoshi Shouji, Miyagi (JP); Shunichi Sato, Miyagi (JP); Akihiro Itoh, Miyagi (JP); Kazuhiro Harasaka, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 93 days.

(21) Appl. No.: 13/940,655

(22) Filed: Jul. 12, 2013

(65) Prior Publication Data
US 2014/0130975 A1   May 15, 2014

Related U.S. Application Data

(63) Continuation of application No. 13/258,568, filed as application No. PCT/JP2010/054741 on Mar. 15, 2010, now Pat. No. 8,609,447.

(30) Foreign Application Priority Data

May 28, 2009 (JP) ................................. 2009-128434
Jan. 20, 2010 (JP) ................................. 2010-009820

(51) Int. Cl.
*H01L 21/00* (2006.01)
*H01L 27/15* (2006.01)
*H01L 29/22* (2006.01)
*H01L 33/00* (2010.01)

(52) U.S. Cl.
USPC .................. 438/29; 438/39; 257/79; 257/98; 257/E33.069

(58) Field of Classification Search
USPC .................. 438/29, 39; 257/79, 98, E33.069
See application file for complete search history.

(56) References Cited

U.S. PATENT DOCUMENTS 5,493,577 A   2/1996 Choquette et al.
5,923,691 A   7/1999 Sato
(Continued)

FOREIGN PATENT DOCUMENTS

EP   1130720 A1   9/2001
JP   2001-156395   6/2001
(Continued)

OTHER PUBLICATIONS

International Search Report and Written Opinion in PCT/JP2010/054741.
(Continued)

*Primary Examiner* — Luan C Thai
(74) *Attorney, Agent, or Firm* — Cooper & Dunham LLP

(57) ABSTRACT

A disclosed method of manufacturing a surface emitting laser includes laminating a transparent dielectric layer on an upper surface of a laminated body; forming a first resist pattern on an upper surface of the dielectric layer, the first resist pattern including a pattern defining an outer perimeter of a mesa structure and a pattern protecting a region corresponding to one of the relatively high reflection rate part and the relatively low reflection rate part included in an emitting region; etching the dielectric layer by using the first resist pattern as an etching mask; and forming a second resist pattern protecting a region corresponding to an entire emitting region. These steps are performed before the mesa structure is formed.

4 Claims, 25 Drawing Sheets

(56) References Cited

U.S. PATENT DOCUMENTS

| | | | |
|---|---|---|---|
| 5,939,733 | A | 8/1999 | Sato |
| 6,002,700 | A | 12/1999 | Sato |
| 6,072,196 | A | 6/2000 | Sato |
| 6,207,973 | B1 | 3/2001 | Sato et al. |
| 6,233,264 | B1 | 5/2001 | Sato |
| 6,542,528 | B1 | 4/2003 | Sato et al. |
| 6,563,851 | B1 | 5/2003 | Jikutani et al. |
| 6,614,821 | B1 | 9/2003 | Jikutani et al. |
| 6,674,785 | B2 | 1/2004 | Sato et al. |
| 6,765,232 | B2 | 7/2004 | Takahashi et al. |
| 6,803,604 | B2 | 10/2004 | Takahashi et al. |
| 6,927,412 | B2 | 8/2005 | Takahashi et al. |
| 6,959,025 | B2 | 10/2005 | Jikutani et al. |
| 6,975,663 | B2 | 12/2005 | Sekiya et al. |
| 7,078,257 | B2 * | 7/2006 | Sakamoto et al. ............... 438/46 |
| 7,693,204 | B2 | 4/2010 | Sato et al. |
| 7,720,125 | B2 | 5/2010 | Jikutani et al. |
| 7,746,912 | B2 | 6/2010 | Motomura et al. |
| 7,829,904 | B2 | 11/2010 | Coffa et al. |
| 7,944,957 | B2 * | 5/2011 | Suzuki et al. ............... 372/45.01 |
| 7,957,444 | B2 | 6/2011 | Itoh et al. |
| 7,957,447 | B2 * | 6/2011 | Matsushita et al. ...... 372/50.124 |
| 7,978,739 | B2 | 7/2011 | Sugawara et al. |
| 7,981,700 | B2 | 7/2011 | Sato et al. |
| 8,148,229 | B2 * | 4/2012 | Shiba et al. ................... 438/380 |
| 2004/0028103 | A1 | 2/2004 | Ueki |
| 2004/0151221 | A1 | 8/2004 | Yamamoto et al. |
| 2007/0249109 | A1 | 10/2007 | Kamiyama et al. |
| 2008/0024849 | A1 | 1/2008 | Hayashi et al. |
| 2008/0055672 | A1 | 3/2008 | Watanabe et al. |
| 2008/0212636 | A1 | 9/2008 | Sato et al. |
| 2009/0285252 | A1 | 11/2009 | Ishii et al. |
| 2009/0285602 | A1 | 11/2009 | Harasaka et al. |
| 2009/0295902 | A1 | 12/2009 | Sato et al. |
| 2009/0303308 | A1 | 12/2009 | Itoh et al. |
| 2010/0060712 | A1 | 3/2010 | Sato et al. |
| 2010/0214633 | A1 | 8/2010 | Sato et al. |

FOREIGN PATENT DOCUMENTS

| | | |
|---|---|---|
| JP | 3566902 | 6/2004 |
| JP | 2006-100858 | 4/2006 |
| JP | 2006-210429 | 8/2006 |
| JP | 2008-300470 | 12/2008 |
| JP | 2010-153768 | 7/2010 |
| WO | WO2010/061947 A1 | 6/2010 |

OTHER PUBLICATIONS

Korean official action dated Apr. 15, 2013 (including English translation) in corresponding Korean patent application.

* cited by examiner

FIG.6
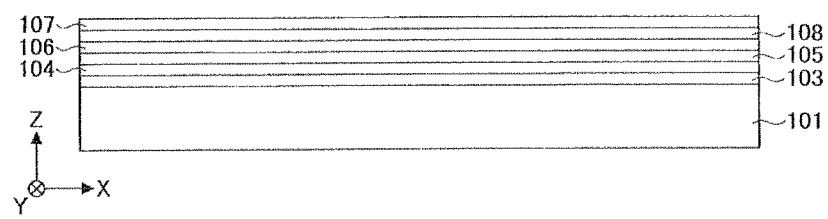
(A)
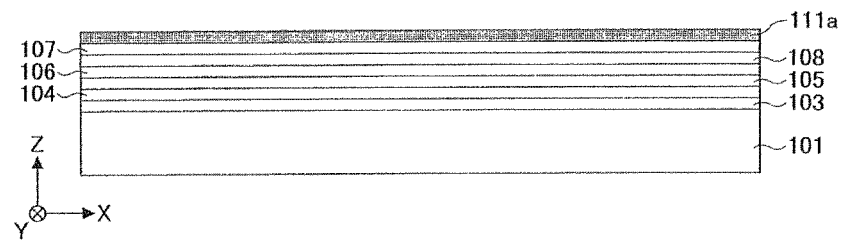
(B)
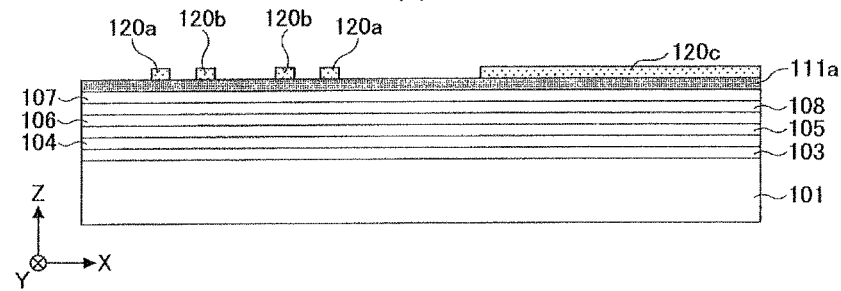
(C)

FIG.8
(A)
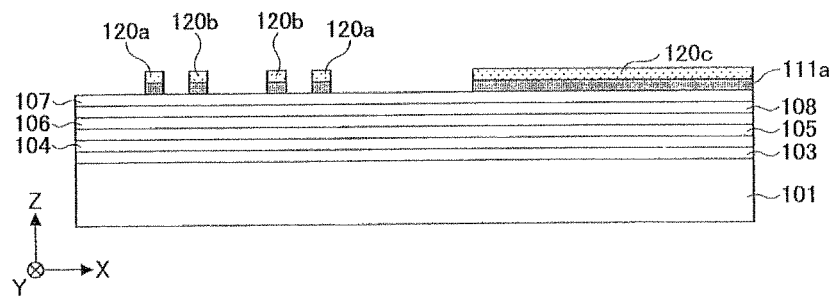
(B)
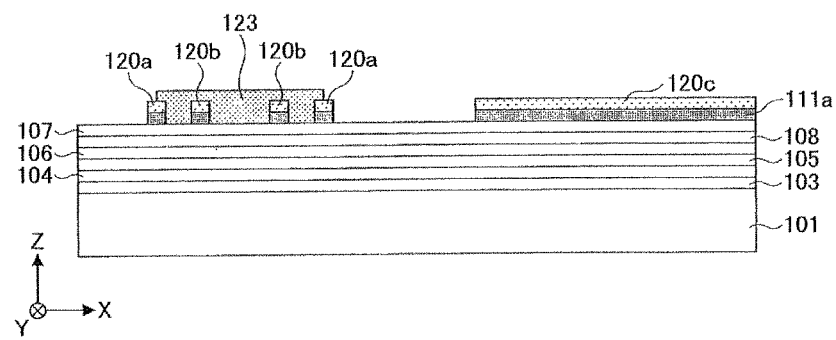

METHOD OF MANUFACTURING SURFACE EMITTING LASER, AND SURFACE EMITTING LASER, SURFACE EMITTING LASER ARRAY, OPTICAL SCANNING DEVICE AND IMAGE FORMING APPARATUS

CROSS-REFERENCE TO RELATED APPLICATIONS

This application is a Rule 1.53(b) continuation of U.S. patent application Ser. No. 13/258,568 filed Sep. 22, 2011 as a Section 371 national stage of PCT/JP2010/054741 filed Mar. 15, 2010 which claims the priority of Japanese patent applications nos. 2009-128434 and 2010-009820 filed with the Japan Patent Office on May 28, 2009 and Jan. 20, 2010, respectively.

TECHNICAL FIELD

The present invention relates to a surface emitting laser, a surface emitting laser array, an optical scanning device, an image forming apparatus, and a method of manufacturing a surface emitting laser. More specifically, the present invention relates to a method of manufacturing a surface emitting laser capable of emitting light in the direction orthogonal to its substrate; a surface emitting laser and a surface emitting laser array capable of emitting light in the direction orthogonal to their substrate; an optical scanning device having the surface emitting laser or the surface emitting laser array; and an image forming apparatus having the optical scanning device.

BACKGROUND ART

A Vertical Cavity Surface Emitting Laser (hereinafter may be referred to as "VCSEL") is a semiconductor Laser capable of emitting light in the direction orthogonal to its substrate. When compared with edge emitting semiconductor lasers capable of emitting light in the direction parallel to its substrate, the VCSEL may have some advantages such as lower cost, lower energy consumption, smaller size, and being appropriately applicable to two-dimensionally integrated devices. Recently, because of those advantages, the VCSEL has attracted increased attention.

The surface emitting laser has a current confined structure to enhance current influx efficiency. To form the current confined structure, a selective oxidation process is usually performed on an AlAs (Al: aluminum, As: arsenic) layer. In the following, the current confined structure may also be referred to as an "oxide-confined structure" for convenience (see, for example, Patent Document 1). The oxide-confined structure may be formed by forming a mesa structure having predetermined sizes and having a side surface where a selectively-oxidized layer is exposed. Then, the formed mesa structure is processed under a water-vapor atmosphere so that aluminum (Al) in the selectively-oxidized layer is selectively oxidized from the side surface of the mesa structure. By doing this, an unoxidized region remains in the center portion of the mesa structure. The unoxidized region (hereinafter referred to as a "confined region" for explanatory purposes) becomes a passing region (or a "current passage region") through which a driving current of the surface emitting laser passes. As described above, the current may be easily contained. The refractive index of the aluminum-oxidized layer ($Al_xO_y$) (hereinafter simplified as an "oxidized layer") in the oxide-confined structure is approximately 1.6, which is lower than that of semiconductor layers. Because of this feature, a refractive index difference is generated in the lateral direction in a resonator structure of the surface emitting laser, and the light is confined in the center of the mesa structure, thereby improving the emission efficiency of the surface emitting laser. As a result, it becomes possible to obtain excellent characteristics such as lower threshold current and higher efficiency.

The surface emitting laser may be generally applied to a light source of an optical writing system in a printer (oscillation wavelength: 780 nm band), a light source of an optical writing system in an optical disk device (oscillation wavelength: 780 nm hand and 850 nm band), and a Light source of an optical transmission system such as LAN (Local Area Network) using optical fibers (oscillation wavelength: 1.3 μm band and 1.5 μm band). Further, the surface emitting laser is also expected to be used as a light source for optical transmission between boards, within a board, and between chips and within a chip in a Large Scale Integrated circuit (LSI).

In those application fields, it is generally required that a cross-sectional shape of the light emitted from the surface emitting laser (hereinafter referred to as "emitting light") be circular. To achieve the circular cross-sectional shape, it is required to control higher-order transverse-mode oscillation.

To that end, for example, Patent Document 2 discloses a method of controlling the transverse-mode oscillation by forming an optically transparent film on an emitting surface and differentiating the reflection rates between the center part and its peripheral part of the emitting region.

SUMMARY OF THE INVENTION

Means for Solving the Problems

The inventors of the present invention have conducted extensive research on this technical field and have obtained a new knowledge that, when an optically transparent film(s) (hereinafter simplified as an "optical filter(s)") is formed on an emitting surface of a laser light (as exemplarily shown in FIGS. 23(A) and 23(B) in), a light emitting angle (indicated in FIG. 23(A)) is influenced by the relative positional relationship between the current passage region and the optical filters. In the figures, an XYZ three-dimensional orthogonal coordinate system is employed, assuming that the Z axis direction is a direction orthogonal to the surface of the substrate. Further, there are two optical filters which face each other and are separated in the x direction.

Further, the "light emitting angle" refers to an inclined angle between the direction orthogonal to surface of the substrate (in this case, Z axis direction) and the direction along which the emitted light intensity is maximized. Herein, a clockwise inclined direction with respect to the direction orthogonal to the surface of the substrate is indicated by a plus sign (+), and on the other hand, a counterclockwise inclined direction with respect to the direction orthogonal to the surface of the substrate is indicated by a minus sign (−).

Further, FIGS. 24 and 25 illustrate a relationship between a positional displacement amount of the centroid of the two optical filters with respect to the center of the current passage region when viewed from a direction orthogonal to the surface of the substrate (hereinafter simplified as "displacement amount") and the light emitting angle.

More specifically, FIG. 24 shows results of experiments conducted to measure the light emitting angle while changing the centroid of the two optical filters with respect to the center of the current passage region in the Y axis direction. In this case, it is assumed that when the direction of the displacement amount is in the +Y direction, the displacement amount is indicated by the plus sign (+); on the other hand, when the direction of the displacement amount is in the −Y direction, the displacement amount is indicated by the minus sign (−). As the results of the experiments, the light emitting angle in the X axis direction is substantially constant and is substantially the same as 0 degrees. when the displacement amount changes in the Y axis direction. On the other hand, the magnitude (absolute value) of the light emitting angle in the Y axis direction is likely to increase as the magnitude (absolute value) of the displacement amount in the Y axis direction increases.

On the other hand, FIG. 25 shows results of experiments conducted to measure the light emitting angle while changing the centroid of the two optical filters with respect to the center of the current passage region in the X axis direction. In this case, it is assumed that when the direction of the displacement amount is in the +X direction, the displacement amount is indicated by the plus sign (+); on the other hand, when the direction of the displacement amount is in the −X direction, the displacement amount is indicated by the minus sign (−). As the results of the experiments, the light emitting angle in the Y axis direction is substantially constant and is substantially the same as 0 degrees. when the displacement amount changes in the X axis direction. On the other hand, the magnitude (absolute value) of the light emitting angle in the X axis direction is likely to increase as the magnitude (absolute value) of the displacement amount in the X axis direction increases.

To obtain high-resolution images in an image forming apparatus, it may be important to form a minute circular light spot at a desired position on a to-be-scanned surface. Further, to form the minute circular light spot at the desired position on the to-be-scanned surface, according to results of various experiments and theoretical calculations, it may be necessary to control the magnitude (absolute value) of the light emitting angle in all the directions to be equal to or less than 0.2 degrees.

To that end, according to the relationship illustrated in FIGS. 24 and 25 or the like, it is necessary to control (reduce) the magnitude (absolute value) of the displacement amount in the surface emitting laser to be equal to or less than 0.1 μm.

However, when the method disclosed in Patent Document 1 is employed, it is difficult to stably manufacture the surface emitting lasers having the magnitude (absolute value) of the displacement amount equal to or less than 0.1 μm.

The present invention is made based on the above-described new knowledge obtained by the inventers of the present invention, and has the following configurations.

According to a first aspect of the present invention, there is provided a method of manufacturing a surface emitting laser. The surface emitting laser includes a laminated body in which a lower reflection mirror, a resonance structure, and an upper reflection mirror are laminated on a substrate, the resonance structure including an active layer, the upper reflection mirror including a selectively-oxidized layer, and a mesa structure formed in the laminated body and capable of serving as an emitting section, the emitting section including a current confined structure and an emitting region, the current confined structure including an oxide surrounding a current passage region, the emitting region including a relatively high reflection rate part and a relatively low reflection rate part. The method of manufacturing a surface emitting laser according to this aspect of the present invention includes a first dielectric layer laminating step of laminating a transparent dielectric layer on an upper surface of the laminated body; a first resist pattern forming step of forming a first resist pattern on an upper surface of the dielectric layer, the first resist pattern including a pattern defining an outer perimeter of the mesa structure and a pattern protecting a region corresponding to one of the relatively high reflection rate part and the relatively low reflection rate part included in the emitting region; a dielectric layer etching at of etching the dielectric layer by using the first resist pattern as an etching mask; and a second resist pattern forming step of forming a second resist pattern protecting a region corresponding to an entire emitting region. Further, in this case, the first dielectric layer laminating step, the first resist pattern forming step, the dielectric layer etching step, and the second resist pattern forming step are performed before the mesa structure is formed.

By having this configuration, it may become possible to stably manufacture the surface emitting lasers having the magnitude (absolute value) of the displacement amount equal to or less than 0.1 μm while better controlling the transverse-mode oscillation.

According to a second aspect of the present invention, there is provided a surface emitting laser including an emitting section having a mesa structure in which a lower reflection mirror, a resonance structure, and an upper reflection mirror are laminated on a substrate, the resonance structure including an active layer, the upper reflection mirror including a current confined structure including an oxide surrounding a current passage region, the emitting section including an emitting region, an entire surface of the emitting region being covered with a transparent dielectric, the emitting region including a relatively high reflection rate part and a relatively low reflection rate part. Further, in the surface emitting laser, when viewed from a direction orthogonal to the substrate after removing an electrode surrounding the emitting region, an outer perimeter of the mesa structure is formed of dielectric, and the thickness of the dielectric is the same as that of a part having two layers of the dielectric in the emitting region.

By having this configuration, it may become possible to control the magnitude (absolute value) of the light emitting angle to be equal to or less than 0.2 degrees. while better controlling the transverse-mode oscillation without incurring high cost.

According to a third aspect of the present invention, there is provided a surface emitting laser array including integrated surface emitting lasers according to the second aspect of the present invention.

In the surface emitting laser array, the surface emitting lasers according to the second aspect of the present invention are integrated. Therefore, in each emitting section, it may become possible to control (reduce) the magnitude (absolute value) of the light emitting angle to be equal to or less than 0.2 degrees. while better controlling the transverse-mode oscillation.

According to a fourth aspect of the present invention, there is provided an optical scanning device capable of scanning a to-be-scanned surface by a light. The optical scanning device includes a light source having a surface emitting laser according to the second aspect of the present invention, a deflector deflecting a light from the light source, and a scanning optical system focusing the light deflected by the deflector onto the to-be-scanned surface.

In this optical scanning device, the light sources including the surface emitting lasers according to the second aspect of the present invention are integrated. Therefore, in each emitting section, it may become possible to perform highly accurate optical scanning without incurring high cost.

According to a fifth aspect of the present invention, there is provided an optical scanning device capable of scanning to-be-scanned surface by a light. The optical scanning device includes a light source having a surface emitting laser array according to the third aspect of the present invention, a deflector deflecting a light from the light source, and a scanning optical system focusing the light deflected by the deflector onto the to-be-scanned surface.

In this optical scanning device, the light sources including the surface emitting laser array according to the third aspect of the present invention are integrated. Therefore, in each emitting section, it may become possible to perform highly accurate optical scanning without incurring high cost.

According to a sixth aspect of the present invention, there is provided en image forming apparatus including an image carrier and an optical scanning device according the fourth or the fifth aspect of the present invention scanning a light on the image carrier, the light being modulated based on image information.

By having this configuration, the image forming apparatus includes an optical scanning device according the fourth or the fifth aspect of the present invention. As a result, it may become possible to form a high-quality image without incurring high cost.

Patent Document 1: U.S. Pat. No. 5,493,577
Patent Document 2: Japanese Patent No. 3566902

BRIEF DESCRIPTION OF THE DRAWINGS

FIGS. 6(A) through 6(C) are drawings (1) showing a method of manufacturing the surface emitting laser according to an embodiment of the present invention;

FIGS. 8(A) and 8(B) are drawings (2) showing the method of manufacturing the surface emitting laser according to the embodiment of the present invention;

DESCRIPTION OF THE REFERENCE NUMERALS

11a: DEFLECTOR-SIDE SCANNING LENS (PART OF SCANNING OPTICAL SYSTEM)
11b: IMAGE-SURFACE-SIDE SCANNING LENS (PART OF SCANNING OPTICAL SYSTEM)
13: POLYGON MIRROR (DEFLECTOR)
14: LIGHT SOURCE
100: SURFACE EMITTING LASER
101: SUBSTRATE
103: LOWER SEMICONDUCTOR DBR (LOWER REELECTION MIRROR)
104: LOWER SPACER LAYER (PART OF RESONATOR STRUCTURE)
105: ACTIVE LAYER
106: UPPER SPACER LAYER (PART OF RESONATOR STRUCTURE)
107: UPPER SEMICONDUCTOR DBR (UPPER REELECTION MIRROR)
108: SELECTIVELY-OXIDIZED LAYER
108a: OXIDE
108b: CURRENT PASSAGE REGION
111a: DIELECTRIC LAYER
111b: DIELECTRIC LAYER
120a: RESIST PATTERN (PART OF FIRST RESIST PATTERN)
120b: RESIST PATTERN (PART OF FIRST RESIST PATTERN)
120c: RESIST PATTERN (PART OF FIRST RESIST PATTERN)
123: SECOND RESIST PATTERN
125: EMITTING REGION
200: SURFACE EMITTING LASER ARRAY
1000: LASER PRINTER (IMAGE FORMING APPARATUS)
1010: OPTICAL SCANNING DEVICE
1030: PHOTOCONDUCTIVE DRUM (IMAGE CARRIER)
2000: COLOR PRINTER (IMAGE FORMING APPARATUS)
2010: OPTICAL SCANNING DEVICE
K1, C1, M1, AND Y1: PHOTOCONDUCTIVE DRUM (IMAGE CARRIER)

MODE FOR CARRYING OUT THE INVENTION

Figure 1:
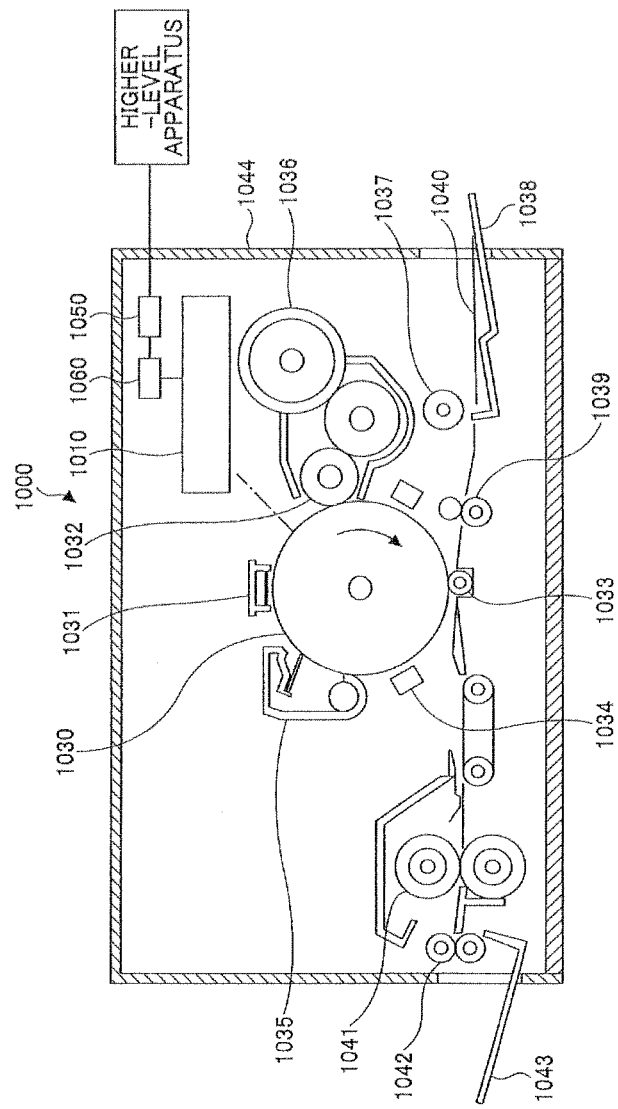
FIG. 1 is a schematic drawing showing a configuration of a laser printer according to an embodiment of the present invention.

In the following, an embodiment of the present invention is described with reference to FIGS. 1 through 14. FIG. 1 schematically shows a configuration of a laser printer 1000 as an image forming apparatus according to an embodiment of the present invention.

As shown in FIG. 1, the laser printer 1000 includes an optical scanning device 1010, a photoconductive drum 1030, a charger 1031, a developing roller 1032, a transfer charger 1033, a neutralization unit 1034, a cleaning unit 1035, a toner cartridge 1036, a feeding roller 1037, a feeding tray 1038, a resist roller pair 1039, a fixing roller 1041, a discharge roller 1042, a discharge tray 1043, a communication control device 1050, and a printer control device 1060 collectively controlling the above parts. Those elements are contained at their predetermined positions in a printer chassis 1044.

The communication control device 1050 controls bi-directional communications with a higher-level apparatus (such as a PC) via a network.

The photoconductive drum 1030 is a cylindrical member having a photoconductive layer formed on its surface. Namely, surface of the photoconductive drum 1030 is a to-be-scanned surface Further, the photoconductive drum 1030 rotates in the arrow direction shown in FIG. 1.

The charger 1031, the developing roller 1032, the transfer charger 1033, the neutralization unit 1034, and the cleaning unit 1035 are disposed near the surface of the photoconductive drum 1030. Further, along the rotating direction of the photoconductive drum 1030, those elements are disposed in order of "charger 1031→developing roller 1032→transfer charger 1033→neutralization unit 1034→cleaning unit 1035".

The charger 1031 uniformly charges the surface of the photoconductive drum 1030.

The optical scanning device 1010 scans a light flux modulated based on image information from the higher-level apparatus onto the surface of the photoconductive drum 1030, the surface having been charged by the charger 1031, so that a latent image corresponding to the image information is formed on the surface of the photoconductive drum 1030. The latent image is moved towards the developing roller 1032 by the rotation of the photoconductive drum 1030. A configuration of the optical scanning device 1010 is described below.

The toner cartridge 1036 stores toner to be supplied to the developing roller 1032.

The developing roller 1032 attaches the toner from the toner cartridge to the latent image formed on the surface of the photoconductive drum 1030 to visualize the image information. The latent image with the toner for convenience, hereinafter referred to as a "toner image") is moved towards the transfer charger 1033 by the rotation of the photoconductive drum 1030.

The feeding tray 1039 stores recording sheets 1040. The feeding roller 1037 is disposed near the feeding tray 1038. The feeding roller 1037 separates the recording sheets 1040 one by one from the feeding tray 1038, and feeds the recording sheet 1040 to the resist roller pair 1039. The resist roller pair 1039 temporarily hold the recoding sheet 1040 separated by the feeding roller 1037, and feeds the recording sheet 1040 towards the gap between the photoconductive drum 1030 and the transfer charger 1033 in synchronization with the rotation of the photoconductive drum 1030.

In this case, a voltage having a polarity opposite to that of the toner is applied to the transfer charger 1033 to electrically attract the toner on the surface of the photoconductive drum 1030 to the recording sheet 1040. Due to this voltage, the toner image on the surface of the photoconductive drum 1030 is transferred to the recording sheet 1040. Then, the transferred recording sheet 1040 is fed towards the fixing roller 1041.

The fixing roller 1041 applies both heat and pressure to the recording sheet 1040 to fix the toner to the recording sheet 1040. The fixed recording sheet 1040 is fed to the discharge tray 1043 by the discharge roller 1042 to be sequentially stacked on the discharge tray 1043.

The neutralization unit 1034 removes electric charges from the surface of the photoconductive drum 1030.

The cleaning unit 1035 removes the toner remaining on the surface of the photoconductive drum 1030 (residual toner). The surface of the photoconductive drum 1030 from which the residual toner has been removed is returned to the position facing the charger 1031 again.

Next, a configuration of the optical scanning device 1010 is described.

Figure 2:
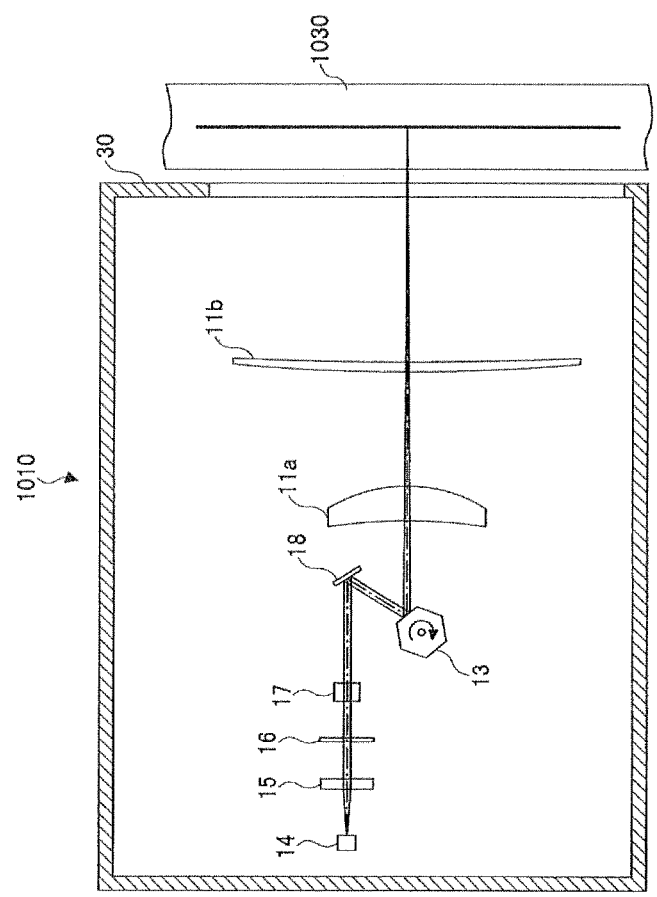
FIG. 2 is a schematic drawing showing a configuration of an optical scanning device in FIG. 1.

As exemplarily shown in FIG. 2, the optical scanning device 1010 may include a deflector-side scanning lens 11a, an image-surface-side scanning lens 11b, a polygon mirror 13, a light source 14, a coupling lens 15, an aperture plate 16, a cylindrical lens 17, a reflection mirror 18, a scanning control device (not shown) and the like. Those elements are fixed in their predetermined positions in a housing 30.

In the following, for convenience, a direction corresponding to the main scanning direction is simplified as "main-scanning corresponding direction", and a direction corresponding to the sub scanning direction is simplified as "sub-scanning corresponding direction".

The coupling lens 15 makes parallel a light flux output from the light source 14 to form a substantially parallel light flux.

The aperture plate 16 has an aperture part defining the beam diameter of the light flux having passed through the coupling lens 15.

The cylindrical lens 17 forms an image of the light flux near a deflection reflection surface of the polygon mirror 13 with respect to the sub-scanning corresponding direction via the reflection mirror 18, the light flux having passed through the aperture part of the aperture plate 16.

The optical system disposed in an optical path between the light source 14 and the polygon mirror 13 may also be called a pre-deflector optical system. In this embodiment, the pre-deflector optical system includes the coupling lens 15, the aperture plate 16, the cylindrical lens 17, and the reflection mirror 18.

The polygon mirror 13 may have, for example, a hexagonal mirror having an inscribed circle having a radius 18 mm, and each mirror serves as a deflection reflection surface. The polygon mirror 13 deflects the light flux from the reflection mirror 18 while rotating at a constant speed about an axis parallel to the sub-scanning corresponding direction.

The deflector-side scanning lens 11a is disposed in an optical path deflected by the polygon mirror 13.

The image-surface-side scanning lens 11b is disposed on an optical path(s) having passed through the deflector-side scanning lens 11a. The light flux having passed through the image-surface-side scanning lens 11b is irradiated onto the surface of the photoconductive drum 1030 so that a light spot is formed on the surface. The light spot moves in the longitudinal direction of the photoconductive drum 1030 by the rotation of the polygon mirror 13. Namely, the light spot scans the photoconductive drum 1030. In this case, the moving direction of the light spot is the "main scanning direction"; and the rotating direction of the photoconductive drum 1030 is the "sub scanning direction".

On the other hand, an optical system disposed in an optical path between the polygon mirror 13 and the photoconductive drum 1030 may also be called a scanning optical system. In this embodiment, the scanning optical system includes the deflector-side scanning lens 11a and the image-surface-side scanning lens 11b. However, the present invention is not limited to this configuration. For example, one or more folding mirrors may be disposed in an optical path between the deflector-side scanning lens 11a and the image-surface-side scanning lens 11b or in an optical path between the image-surface-side scanning lens 11b and the photoconductive drum 1030.

Figure 3:
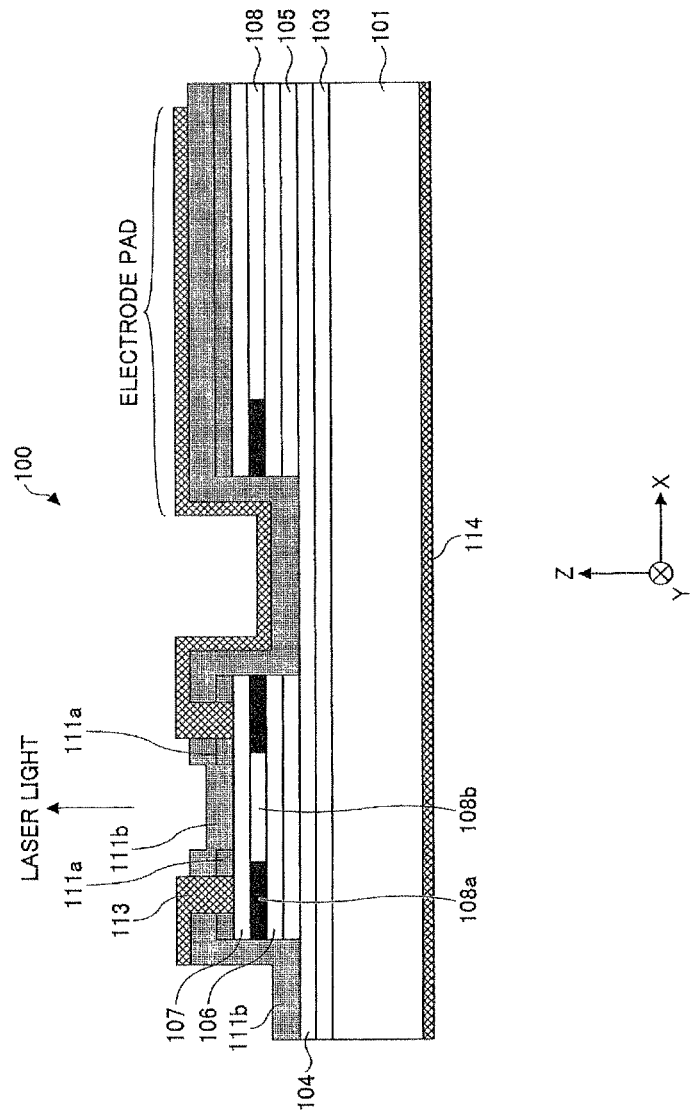
FIG. 3 is a drawing showing a configuration of a surface emitting laser included in a light source of FIG. 2.
Figure 4:
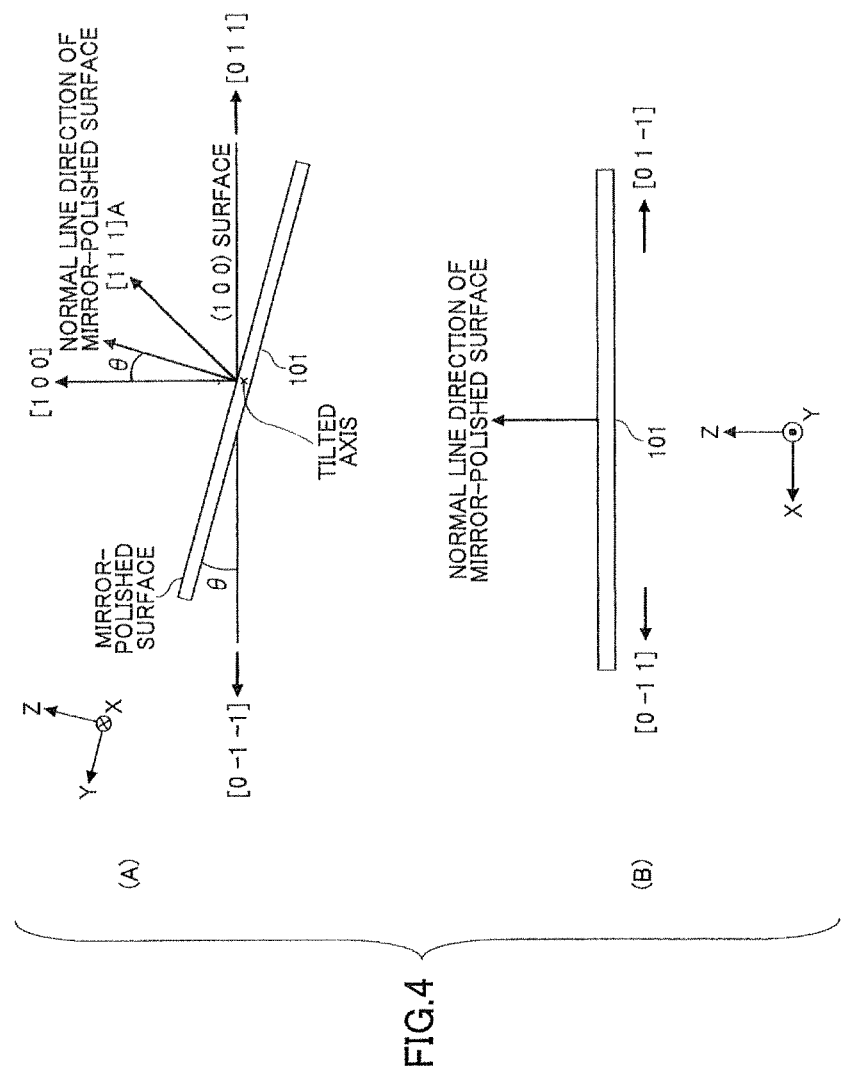
FIGS. 4(A) and 4(B) are drawings showing a substrate of the surface emitting laser.

For example, the light source 14 includes such a surface emitting laser 100 as shown in FIG. 3. In the present specification, it is assumed that the laser oscillation direction is the Z axis direction and two directions orthogonal to each other on a plane surface orthogonal to the Z axis are the X axis and the Y axis. Further, FIG. 3 is a cross-sectional view of the surface emitting laser 100 along a surface parallel to the XZ plane.

The oscillation wavelength of the surface emitting laser is 780 nm band. Further, as shown in FIG. 3, the surface emitting laser 100 includes a substrate 101, a lower semiconductor DBR 103, a lower spacer layer 104, an active layer 105, an upper spacer layer 106, an upper semiconductor DBR 107 and the like.

The substrate 101 is a n-GaAs single crystal substrate having a mirror-polished surface. Further, as shown in FIG. 4(A), the normal line direction of the mirror-polished surface (main surface) is inclined 15 degrees ($\theta$=15 degrees) towards A direction of crystal orientation [1 1 1] with respect to the direction of crystal orientation [1 0 0]. Namely, the substrate 101 is so-called a tilted substrate. As shown in FIG. 4(B), the substrate 101 is disposed in a manner such that the direction of crystal orientation [0 −1 1] is +X direction and the direction of crystal orientation [0 1 −1] is −X direction.

Referring back to FIG. 3, the lower semiconductor DBR 103 is laminated on the +Z side surface of the substrate 101 via a buffer layer (not shown). Further, the lower semiconductor DBR 103 includes 37.5 pairs of a low refractive index layer formed of n-$Al_{0.9}Ga_{0.1}As$ and a high refractive index layer formed of n-$Al_{0.3}Ga_{0.7}As$. Further, between adjacent refractive index layers, to reduce electric resistance, there is provided a composition-graded layer having a thickness of 20 nm in which composition is gradually changed from one composition to the other composition. Further, the refractive index layers are formed in a manner such that the optical thickness of one refractive index layer and ½ (half) of the two adjoining composition-graded layers is equal to $\lambda/4$, where the symbol $\lambda$ denotes the oscillation wavelength. When the optical thickness is equal to $\lambda/4$, the practical thickness (D) of the layer is given as $D=\lambda/4n$, where a symbol n denotes the refractive index of the medium of the layer.

The lower spacer layer 104 is laminated on the +Z side of the lower semiconductor DBR 103, and formed of non-doped $Al_{0.6}Ga_{0.4}As$.

Figure 5:
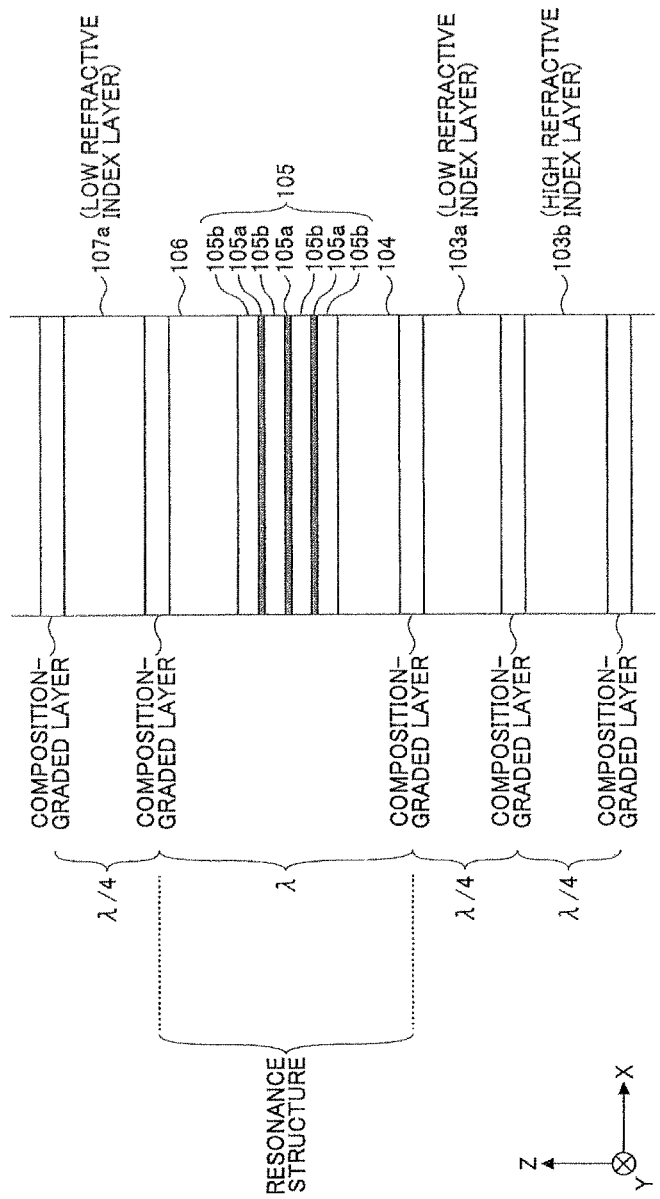
FIG. 5 is an enlarged drawing showing an active layer.

The active layer 105 is laminated on the +Z side of the lower spacer layer 104, and may have, for example, a triple quantum well structure having three quantum well layers 105a and four barrier layers 105b as shown in FIG. 5. The quantum well layers 105a are formed of $Al_{0.12}Ga_{0.88}As$, and the barrier layers 105b are formed of $Al_{0.3}Ga_{0.7}As$.

The upper spacer layer 106 is laminated on the +Z side of the active layer 105, and formed of non-doped $Al_{0.6}Ga_{0.4}As$.

A part including the lower spacer layer 104, the active layer 105, and the upper spacer layer 106 may also be called a resonator structure, and is formed in a manner such that the optical thickness of the resonator structure and ½ (half) of the two adjoining composition-graded layers is equal to one wavelength. Further, the active layer 105 is disposed at the middle of the resonator structure where a loop of an electric field standing wave is to be formed so as to obtain higher induced emission probability.

Referring back to FIG. 3, the upper semiconductor DBR 107 is laminated on the +Z side of the upper spacer layer 106, and includes 24 pairs of a low refractive index layer formed of p-$Al_{0.9}Ga_{0.1}As$ and a high refractive index layer formed of p-$Al_{0.3}Ga_{0.7}As$.

Further, between adjacent refractive index layers in the upper semiconductor DBR 107, to reduce electric resistance, there is provided a composition-graded layer in which composition is gradually changed from one composition to the other composition. Further, the refractive index layers are formed in a manner such that the optical thickness of one refractive index layer and ½ (half) of the two adjoining composition-graded layers is equal to $\lambda/4$.

Further, in the upper semiconductor DBR 107, a selectively-oxidized layer 108 formed of p-AlAs is provided (formed) in a manner such that the selectively-oxidized layer 108 is separated from the resonator structure by an optical length of $\lambda/4$. However, in FIG. 3, for convenience, the selectively-oxidized layer 108 is provided (depicted) between the upper semiconductor DBR 107 and the resonator structure.

Further, on the +Z side of the upper semiconductor DBR 107, a contact layer (not shown) formed of p-GaAs is provided (formed).

In the following, for convenience, the structure in which the plural semiconductor layers are laminated on the substrate 101 may also be called a "laminated body".

Next, a method of manufacturing the surface emitting laser 100 is described.

(1): The above laminated body is formed by crystal growth by the MOCVD (Metal Organic Chemical Vapor Deposition) method or the MBE (Molecular Beam Epitaxy) method (see FIG. 6(A)).

In this case, trimethyl aluminium (TMA), trimethyl gallium (TMG), and trimethyl indium (TMI) are used as group III materials, and phosphine ($PH_3$) and arsine ($AsH_3$) are used as group V materials. Further, Carbon tetrabromide ($CBr_4$) and dimethylzinc (DMZn) are used as p-type dopant materials, and hydrogen selenide ($H_2Se$) is used as an n-type dopant material.

(2): An optically transparent dielectric layer 111a of P—SiN ($SiN_x$) is formed by using the P-CVD method (plasma CVD method) (see FIG. 6(B)). In this case, the optical thickness of the dielectric layer 111a is set to be equal to $\lambda/4$. More specifically, the refractive index n of SiN is 1.83 and the oscillation wavelength $\lambda$ is 780 nm; therefore, the practical film thickness ($\lambda/4n$) of the dielectric layer 111a is set to be 103 nm.

(3): A first resist is applied to the surface of the dielectric layer 111a, so that resist patterns 120a, 120b, and 120c are formed. The resist pattern 120a is formed to define an outer perimeter of a mesa structure; the resist patterns 120b are formed to mask the region where the reflection rate is to be low in an emitting region; and the resist pattern 120c is formed to mask the region where an electrode pad is to be formed (see FIG. 6(C).

In this case, the resist patterns 120a and 120b are formed at the same time. Due to this feature, a displacement of relative positional relationship between the resist pattern 120a and the resist patterns 120b does not occur.

Figure 7:
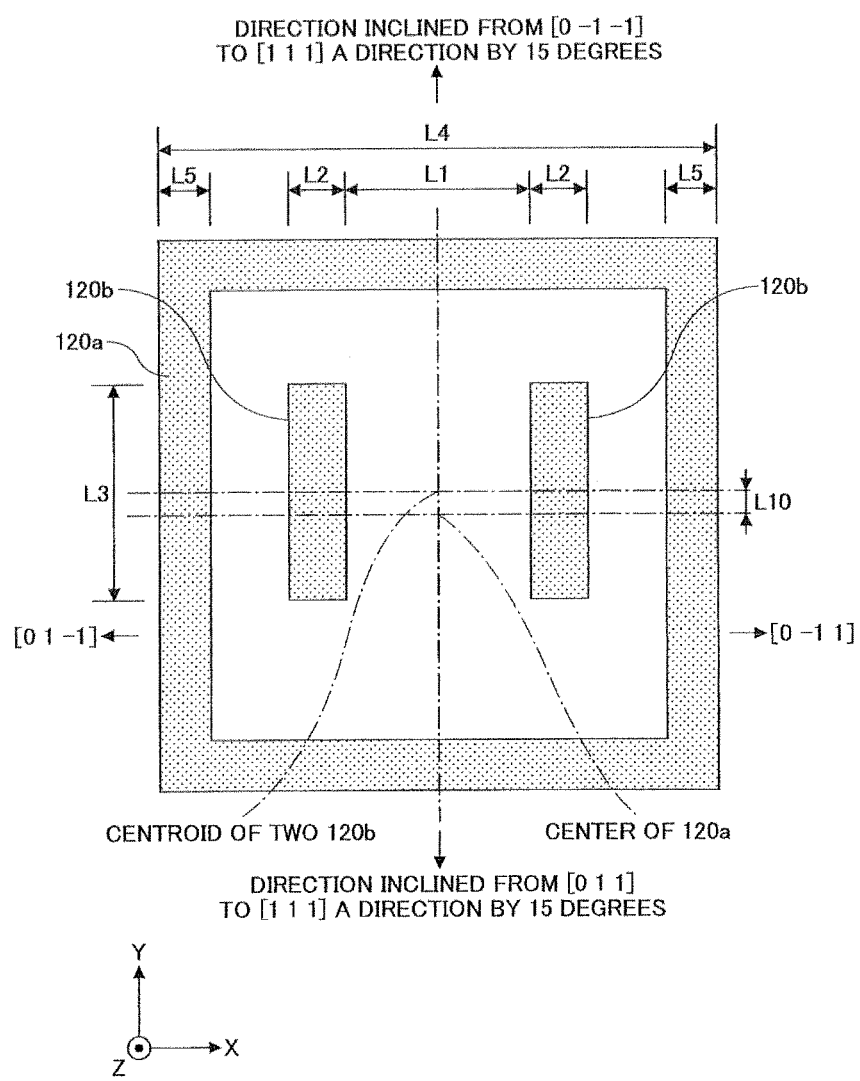
FIG. 7 is a drawing showing resist patterns 120a and 120b.

As shown in FIG. 7, the resist pattern 120a has a square shaped outer perimeter having one side of length L4, and is a closed pattern having a width L5. Further, as shown in FIG. 7, each of the resist patterns 120b has a rectangular shape having a width in X axis direction of L2 and a length in Y axis direction of L3. Those resist patterns 120b are separated from each other by distance L1 in the X axis direction. In this case, it is assumed that L1=5 μm, L2=2 μm, L3=8 μm, L4=20 μm, and L5=2 μm.

Further, the centroid of the two resist patterns 120b is displaced from the center of the resist pattern 120a to the +Y side by distance L10. In this embodiment, the substrate 101 is a tilted substrate (see FIGS. 4(A) and 4(B)). Because of this feature, the crystal orientations orthogonal to tour respective side walls of the mesa structure are to be different from each other (see FIG. 7). Because of the difference of the crystal orientations, oxidation rates may be more likely to differ among the side walls in an oxidation process. As a result of this feature, the center of a current confined structure in which the oxide surrounds a current passage region may be displaced from the center of the mesa structure.

In this embodiment, the oxidation rates differ in order of: the direction inclined from the [0 1 1] direction to the [1 1 1] A direction by 15 degrees>[0 1 −1] direction=[0 −1 1] direction>the direction inclined from the [0 1 −1] direction to the [1 1 1] A direction by 15 degrees.

Because of the differences in the oxidation rates, the center of the current confined structure is displaced from the center of the mesa structure by approximately 0.6 μm in the direction inclined from the [0 −1 −1] direction to the [1 1 1] A direction by 15 degrees.

To compensate for the displacement, by previously displacing the centroid of the two resist patterns 120b from the center of the resist pattern 120a to the +Y side by distance L10 (0.6 μm in this case), may become possible that the center of the current confined structure after the oxidization process substantially corresponds to the position of the centroid of the two resist patterns 120b.

Further, a surface orientation dependency of the oxidation rate may depend on oxidation conditions; therefore, it should be noted that the displacement amount and the displacement direction described herein are for explanatory purposes only. Namely, the displacement amount and the displacement direction are not limited to the examples described herein.

In the following, the resist patterns formed as described above may also be collectively called a "first resist pattern".

As the first resist, a general positive resist may be used. In this embodiment, a resist of OFPR800-64cp (TOKYO OHKA KOGYO CO., LTD) is used. Further, when the first resist is applied, a spin coater may be used so that the film thickness of the first resist can be equal to approximately 1.6 μm by adjusting the rotational speed of the spin coater. Then, exposure, development, and post baking (e.g. 2 minutes at 120° C.) processes are sequence performed to form the first resist pattern, (4): The laminated body on which the first resist pattern is formed is placed on a hot plate heated at 150° C. for five minutes. By heating in this way, the first resist pattern is hardened. In the following, this process may also be called a "hardening process".

(5): The dielectric layer 111a is etched by the ECR (Electron Cyclotron Resonance) etching method using $Cl_2$ gas. By this etching, a part of the dielectric layer 111a which is not masked by the first resist pattern is removed (see FIG. 8(A)).

Figure 9:
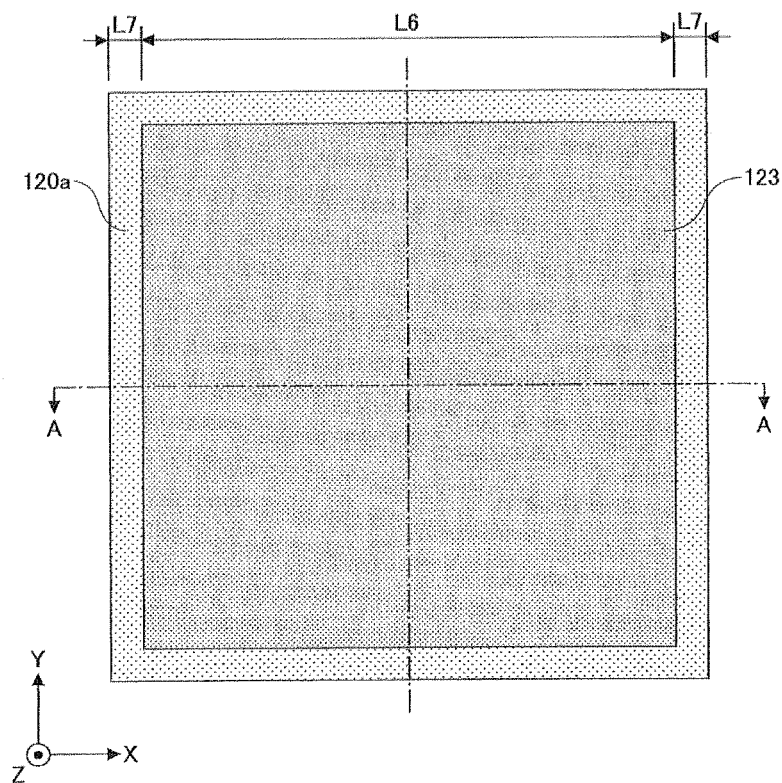
FIG. 9 is a drawing showing a second resist pattern.

(6): A second resist is applied to form a second resist pattern 123 to cover a region surrounded by the resist pattern 120a (see FIG. 8(B)). As shown in FIG. 9, the resist pattern 123 is a square-shaped pattern having a side length of L6. In this case, for example, it is assumed that L6=18 μm and width L7=1 μm.

The same resist as the first resist is used as the second resist. Therefore, the second resist may be formed under the same conditions as those of the first resist.

Further, as described above, the first resist pattern is hardened before the second resist is applied. Because of this feature, when the second resist is applied, the first resist pattern is not dissolved in a solvent of the second resist. As a result, a two-layered resist structure is formed. In this case, preferably, the heating temperature to harden the first resist pattern is equal to or higher than 150° C. According to experiments, when the heating temperature was 140° C., the first resist started dissolving by just applying the second resist, and the shape of the first resist pattern was deformed.

Further, when the second resist is exposed, a part of the first resist pattern which is not covered by the second resist pattern 123 is also exposed. However, since the first resist pattern has been hardened, the part of the first resist pattern is not developed in the following developing process. As a result, the size of the first resist pattern may not be changed.

Figure 10:
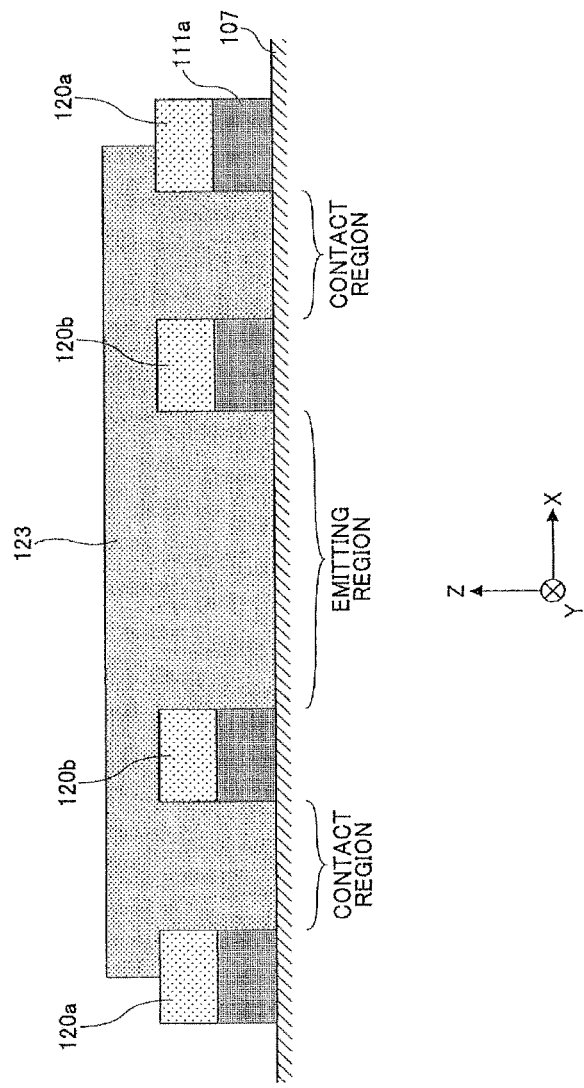
FIG. 10 is a cross-sectional view along line A-A' of FIG. 9.
Figure 11:
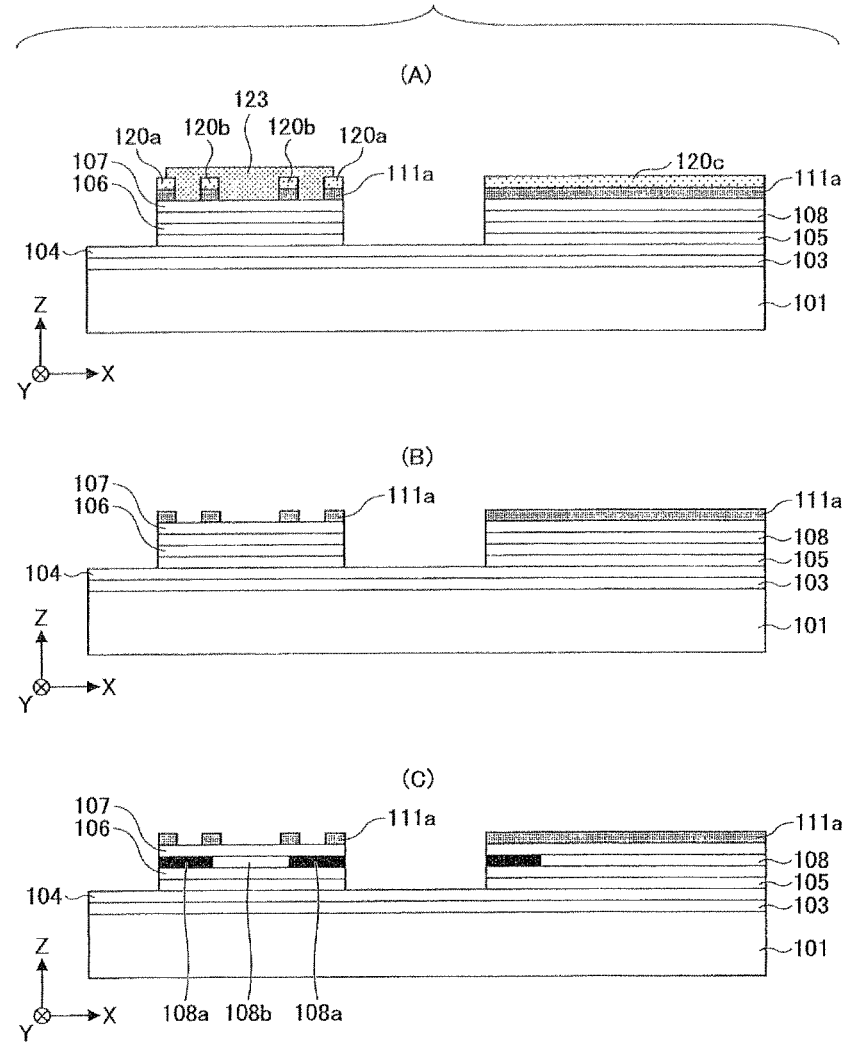
FIGS. 11(A) through 11(C) are drawings (3) showing the method of manufacturing the surface emitting laser according to the embodiment of the present invention.
Figure 12:
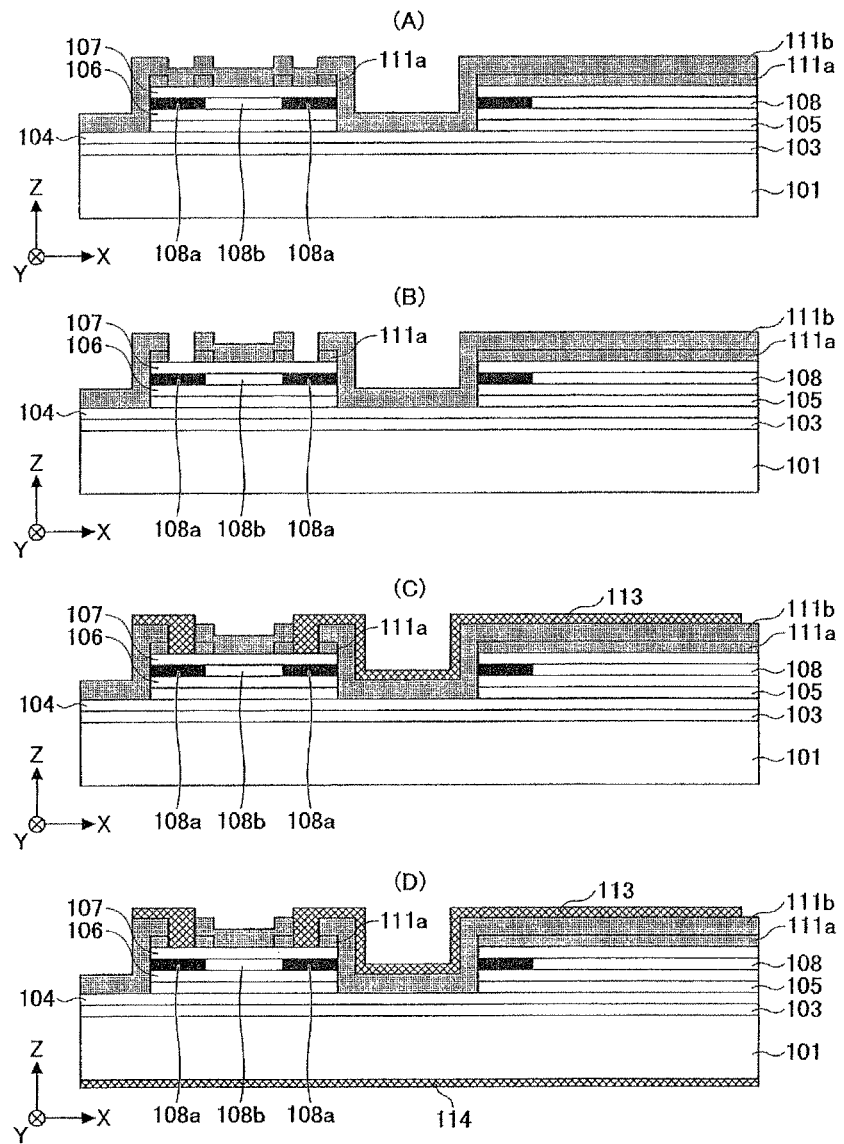
FIGS. 12(A) through 12(D) are drawings (4) showing the method of manufacturing the surface emitting laser according to the embodiment of the present invention.

For example, as shown in FIG. 10, which is a cross-sectional view along A-A line in FIG. 9, the second resist pattern 123 may be formed to protect contact regions and the emitting region on the surface of the mesa structure. In this case, it is assumed that length L6=18 μm, which is shorter than one side of the outer perimeter of the resist pattern 120a by 2 μm. This difference of 2 μm may be regarded as a margin for alignment displacement.

(7): By the ECR etching method using $Cl_2$ gas, the laminated body is etched using the first resist pattern and the second resist pattern 123 as etching masks to form the mesa structure (hereinafter simplified as "mesa") having side surfaces where the selectively-oxidized layer 108 is exposed. In this case, this etching is set to bexpose the upper surface of the lower spacer layer 104 (see FIG. 11(A)).

The outer perimeter of the resist pattern 120a defines the outer perimeter of the mesa. Because of this feature, the relative positional relationship between the outer perimeter of the mesa and the region where the reflection rate is low in the emitting region may not be changed.

(8): The etching masks are removed by immersing the etching masks into acetone liquid, followed by an ultrasonic cleaning (see FIG. 11(B)).

(9): The laminated body is heated in water vapor. By doing this, Al (aluminum) in the selectively-oxidized layer 108 is selectively oxidized from the outer peripheral portions of the mesa, so that a non-oxidized region 108b surrounded by the Al oxide (oxidized layer) 108a remains at the center portion of the mesa (see FIG. 11(C)). Namely, so-called an oxide-confined structure is formed, capable of limiting the passage of the driving current of the emitting section to the center portion of the mesa only. This non-oxidized region 108b may also be called a current passage region (current injection region). By doing this, the current passage region having a square shape of length, for example, 4.5 μm may be formed.

(10): An optically transparent dielectric layer 111b of P—SiN ($SiN_x$) is formed by using the P-CVD method (see FIG. 12(A)). In this case, the optical thickness of the dielectric layer 111a is set to be equal to $2\lambda/4$. More specifically, the refractive index n of SiN is 1.83 and the oscillation wavelength $\lambda$ is 780 nm; therefore, the practical film thickness ($2\lambda/4$ n) of the dielectric layer 111b is set to be 206 nm.

(11): An etching mask is formed on the upper surface of the mesa to open windows to the respective contact regions.

(12): The dielectric layer 111b is etched by BHF to open windows to the respective contact regions.

(13): The etching masks are removed by immersing the etching masks into acetone liquid, followed by ultrasonic cleaning (see FIG. 12(B)).

(14): A resist pattern having a square shape having a side length of 10 μm is formed in a region to be formed as a light emitting section on the upper side of the mesa, and a p-side electrode material is vapor-deposited. As the p-side electrode material, a multilayer film made of Cr/AuZn/Au or a multilayer film made of Ti/Pt/Au is used.

(15): The electrode material vapor-deposited at the region to be formed as the light emitting section on the upper side of the mesa is lifted off to form a p-side electrode 113 (see FIG. 12(C)) The region surrounded by the p-side electrode 113 is the emitting region.

(16): After polishing the rear side of the substrate 101 so that the thickness of the substrate 101 is equal to a predetermined thickness (e.g., approximately 100 μm), an n-side electrode 114 is formed (see FIG. 12(D)). In this case, as the n-side electrode material, a multilayer film made of AuGe/Ni/Au or a multilayer film made Ti/Pt/Au is used.

(17): An annealing process is performed so as to produce the ohmic conductivity, of the p-side electrode 113 and the n-side electrode 114. By doing this, the mesa becomes the light emitting section.

(18) The laminated body is cut into chips.

Figure 13:
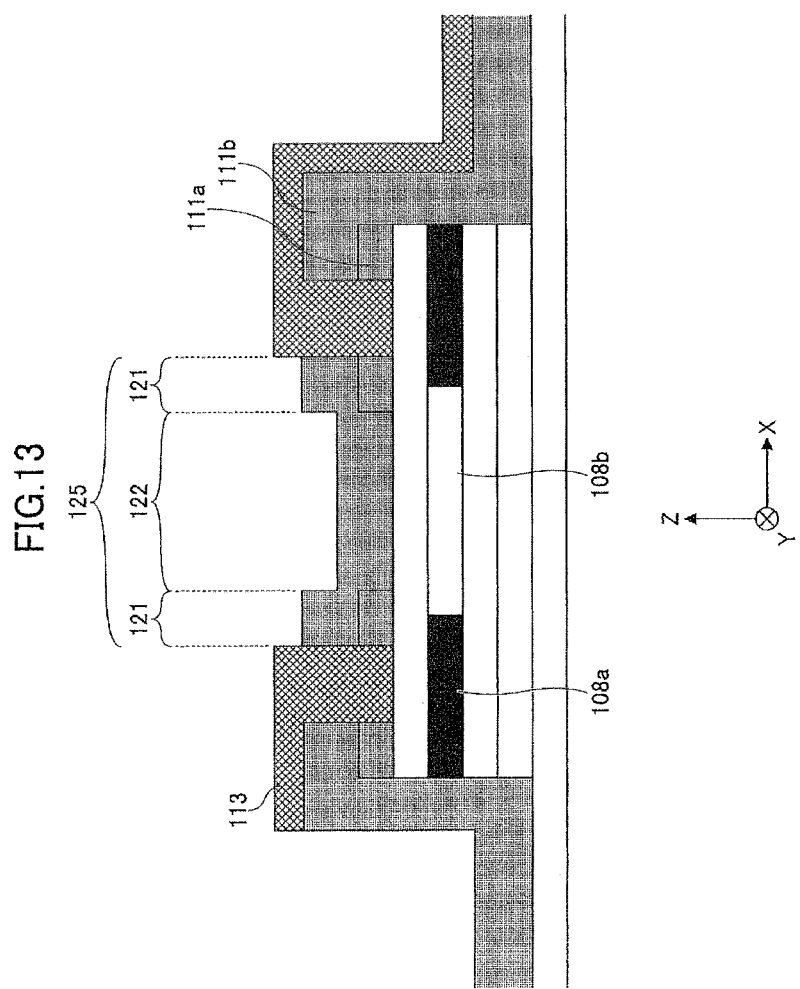
FIG. 13 is a partially enlarged drawing (1) showing a mesa structure in FIG. 12(D)
Figure 14:
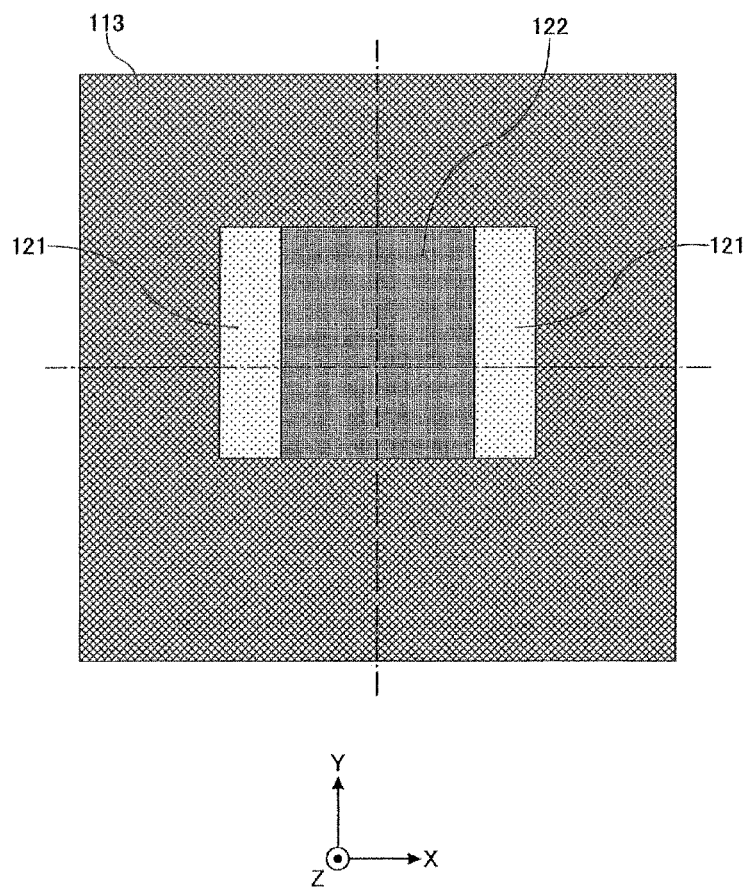
FIG. 14 is a partially enlarged drawing (2) showing the mesa structure in FIG. 12(D)

FIGS. 13 and 14 are partially enlarged drawings showing the mesa in FIG. 12(D). The emitting region 125 has a square shape having a side length of 10 μm. In this embodiment, the emitting region 115 is covered with the transparent dielectric formed of P—SiN. This dielectric includes a relatively high reflection rate region 122 having an optical thickness equal to $2\lambda/4$ and relatively low reflection rate regions 121 having an optical thickness equal to $3\lambda/4$.

The two low reflection rate regions 121 are disposed at respective edge portions of the emitting region 125 in the X axis direction. Further, when viewed from the Z axis direction, the displacement between the centroid of the two low reflection rate regions 121 and the center of the current passage region 108b was equal to or less than 0.1 μm.

When the light emitting angles of the plural surface emitting lasers 100 having been manufactured as described above are measured, all the light emitting angles in the X axis direction and in the Y axis direction were equal to or less than ±0.2 degrees.

As is apparent from the above description, as a method of manufacturing the surface emitting lasers, the method of manufacturing the surface emitting lasers 100 according to an embodiment of the present invention is used.

As described above, in the surface emitting laser 100 according to an embodiment of the present invention, on the substrate 101, the resonance structure including the lower semiconductor DBR 103 and the active layer 105, upper semiconductor DBR 107 including the selectively-oxidized layer 108 and the like are laminated.

Further, the entire emitting region 125 is covered with the optically transparent dielectric formed of P—SiN; and the emitting region 125 includes the relatively high reflection rate region 122 and the relatively low reflection rate regions 121.

Further, when the surface emitting lasers 100 are manufactured, the resist pattern 120a and the resist pattern 120b are formed at the same time. Because of this feature, the relative positional relationship between the outer perimeter of the mesa and the two low reflection rate regions 121 may be highly accurately and ably determined based on a desired relative positional relationship. Therefore, even when the surface emitting lasers 100 are manufactured on a large scale, it may become possible to stably reduce the magnitude (absolute value) of the displacement amount between the centroid of the two low reflection rate regions 121 and the center of the current passage region 108b to be equal to or less than 0.1 μm; and it may become possible to stably reduce the magnitude (absolute value) of the light emitting angle in all the directions to be equal to or less than 0.2 degrees.

In this case, in the surface emitting laser 100, when viewed from a direction orthogonal to the surface of the substrate after removing the p-side electrode 113, the outer peripheral portion on the upper surface of the mesa is covered with the optically transparent dielectric formed of P—SiN, and the thickness of the dielectric is the same as that of the part where two-layer dielectric is formed (low reflection rate regions 121).

Further, in the emitting region 125, the reflection rate in the outer peripheral part is relatively lower than that in the center part. Because of this feature, the higher-order transverse-mode oscillation may be better controlled without reducing the fundamental transverse mode of output light. Namely, the transverse mode of oscillation may be better controlled.

Further, the region of the relatively high reflection rate in the center part of the emitting region has a shape having anisotropy with respect to two directions orthogonal to each other, so that anisotropy is intentionally introduced with respect to a confining function in the transverse direction of the laser light; therefore it may become possible to improve the stability of the polarization direction.

Further, it may become possible to control the higher-order transverse-mode and stabilize the polarization direction without reducing an area of the current passage region 108b. Due to this feature, the electric resistance of the surface emitting laser may not be increased, and the current density in the current confined region may not be increased. As a result, the service lifetime of the device may not be reduced.

Further, the entire emitting region is covered with dielectric. Because of this feature, oxidization and contamination of the emitting region may be controlled.

Further, the side surfaces of the mesa are covered with the dielectric layer 111b. Because of this feature, the destruction of the device caused due to moisture absorption may be prevented, and long-term reliability may be enhanced.

Further, the same resist is used as the first resist and the second resist. Therefore, it may not be necessary to significantly change the processes from those in a conventional manufacturing method.

In the optical scanning device 1010 according to an embodiment of the present invention, the light source 14 includes surface emitting lasers 100 and 100'. In this case, the magnitude (absolute value) of the light emitting angle is equal to or less than 0.2 degrees, and a single fundamental transverse mode laser light is obtained. Therefore, a tiny circular light spot may be easily formed at a desired position on the surface of the photoconductive drum 1030. Further, the polarization direction is stable. Therefore, the shape of the light spot, the light amount and the like are unlikely to be affected. As a result, a tiny circular light spot having high light density may be imaged (formed) at a desired position on the surface of the photoconductive drum 1030 by using a simple optical system; therefore, highly-accurate optical scanning may be performed there.

The laser printer 1000 according to an embodiment of the present invention includes the optical scanning device 1010. Therefore, a high-quality image may be formed.

Figure 15:
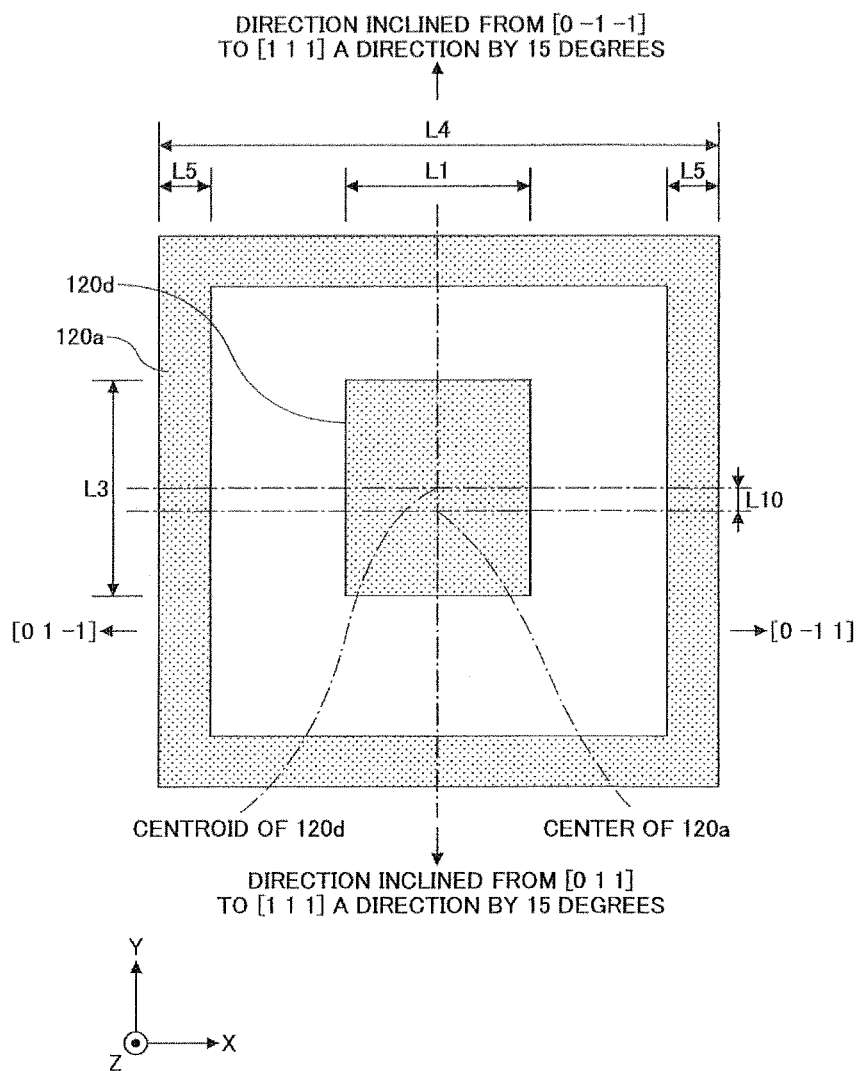
FIG. 15 is a drawing showing a modified method of manufacturing the surface emitting laser according to an embodiment of the present invention.
Figure 16:
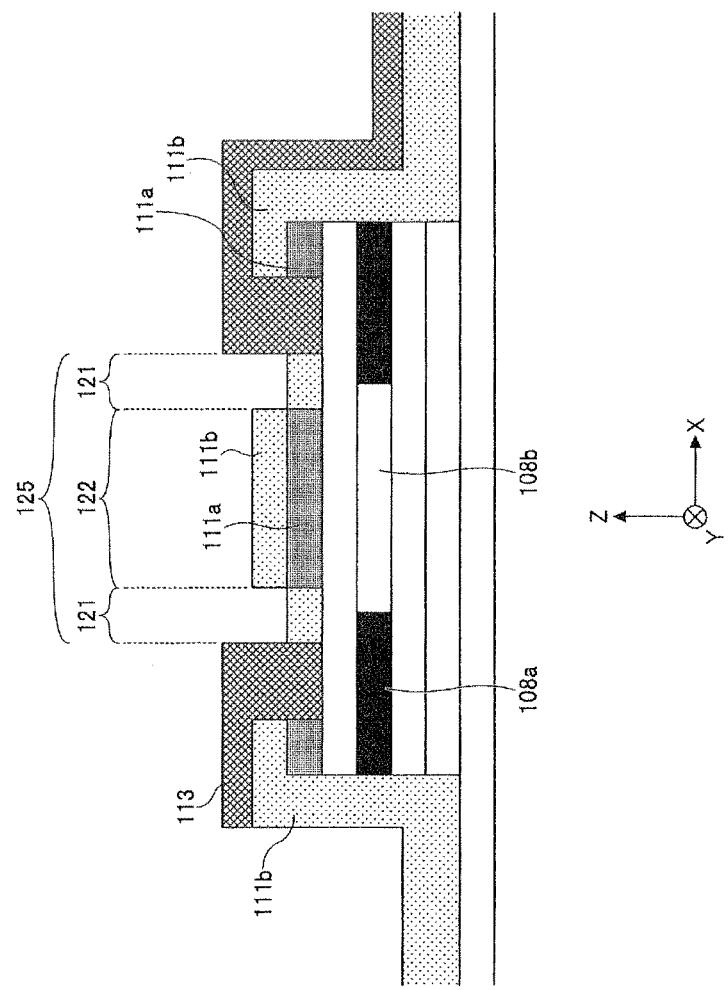
FIG. 16 is a vertical cross-sectional view of the surface emitting laser of FIG. 15.

Further, in the above embodiment, in above step (3), instead of forming the resist pattern 120b, a resist pattern 120d to mask a region corresponding to a part where the reflection rate is high at the center part of the emitting region may be formed as shown in FIG. 15. In this case, in above step (10), the dielectric layer 111b is formed so that the optical thickness of the dielectric layer 111b is equal to either $\lambda/4$ or $(\lambda/4)+$(an even multiple of $\lambda/4$). FIG. 16 is an exemplary vertical cross-sectional view of a surface emitting laser manufactured in this way (for convenience, "surface emitting laser 100'"). In this configuration shown in FIG. 16, the dielectric layer 111a is formed of $SiO_2$, and the dielectric layer 111b is formed of SiN. Further, the film thickness of the dielectric in the center part of the emitting region is set to be equal to $2\lambda/4$, and the film thickness of the dielectric in the outer peripheral part of the emitting region in set to be equal to $\lambda/4$. Further, the high reflection rate region 122 is formed in the center part of the emitting region and the low reflection rate regions 121 is formed in the outer peripheral part of the emitting region. In this surface emitting laser 100', the difference in reflection rate between the high reflection rate region 122 and the low reflection rate regions 121 is greater than that in the surface emitting laser 100. Therefore, the fundamental transverse mode output may be further increased.

Further, in the above embodiment, a case is described where the dielectric layer is formed of P—SiN. However, the present invention is not limited to this configuration. For example, the dielectric layer may be formed of any of $SiO_x$, $TiO_x$ and SiON. In any case, a similar effect may be obtained by appropriately determining the film thicknesses based on their respective refractive index values.

Figure 17:
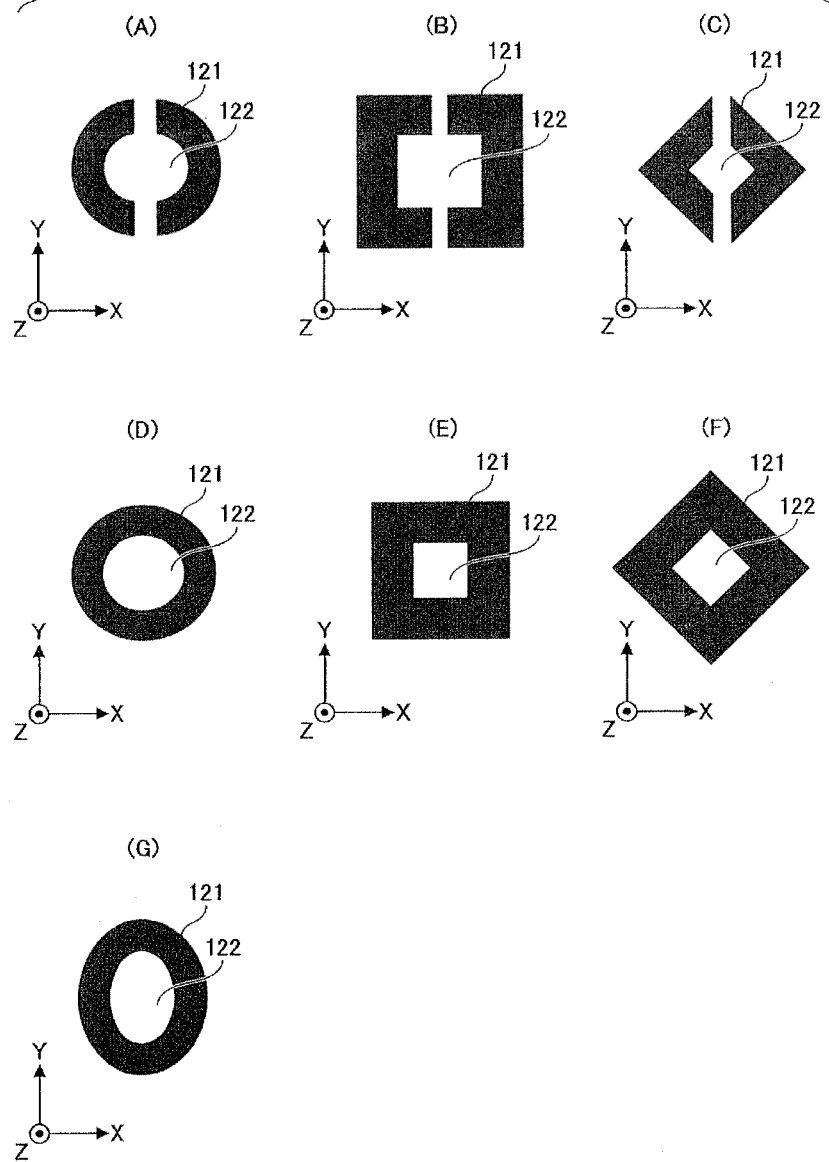
FIGS. 17(A) through 17(G) are drawings (1) showing modified configurations of a high reflection rate region 122 and a low reflection rate region 121.

Further, in the above embodiment, a case is described where the shape of the low reflection rate regions 121 is rectangular. However, the present invention is not limited to this configuration. For example, the shape of the low reflection rate regions 121 may be a curved or angled shape as shown in FIGS. 17(A) through 17(C).

Further, in the above embodiment, a case is described where the low reflection rate part is separated into parts. However, the present invention is not limited to this configuration. For example, a single low reflection rate part may be formed as shown in FIGS. 17(D) through 17(G).

Figure 18:
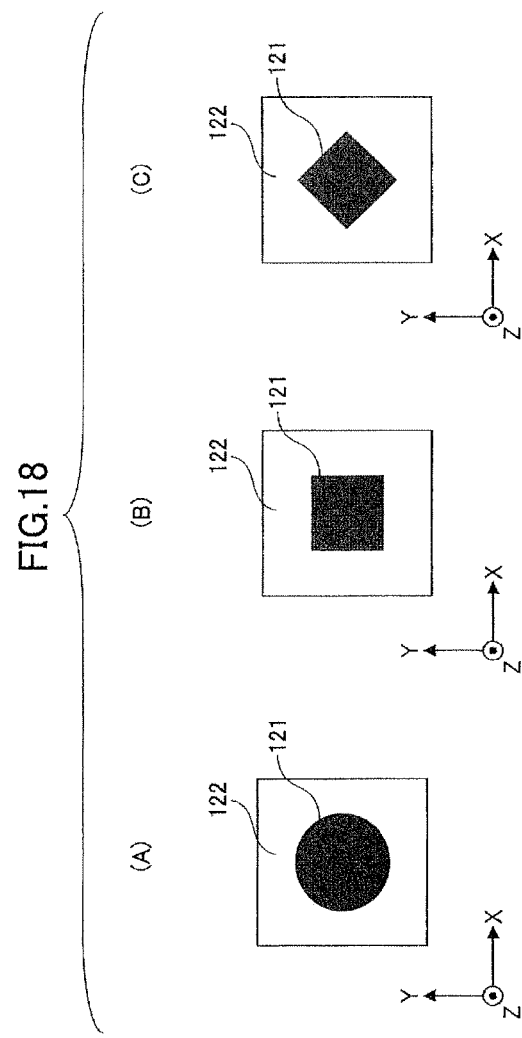
FIGS. 18(A) through 18(C) are drawings (2) showing modified configurations of the high reflection rate region 122 and the low reflection rate region 121.

Further, as shown in FIGS. 18(A) through 18(C), the low refraction rate part 121 may be formed in the center part of the emitting region and the high reflection rate region 122 may be formed in the outer peripheral part of the emitting region, so that higher-order mode can be selectively operated.

Further, in the above embodiment, a case is described where the positive resist is used as the first resist and the second resist as well. However, the present invention is not limited to this configuration. For example, a negative resist such as OMR85-45cp (TOKYO OHKA KOGYO CO., LTD) may be used as the first resist, and a positive resist such as OFPR800-64cp (TOKYO OHKA KOGYO CO., LTD) may be used as the second resist. Even in this case, the relative positional relationship between the outer perimeter of the mesa and the two low reflection rate regions 121 may be highly accurately and stably determined in accordance with a desired relative positional relationship.

In this case, the solvents differ depending on the resists. Therefore, after the first resist pattern has been formed, even when the second resist is applied, the first resist pattern may not be dissolved. Therefore, the hardening process may not be necessarily performed on the first resist pattern.

Further, in this case, even when a part of the first resist pattern which is not covered by the second resist pattern 123 is exposed, the composition of the part of the first resist pattern may be changed to be hardened. Therefore, the size of the of the first resist pattern may not be changed. Needless to say, different developing fluids are used depending on the resist patterns. Therefore, when the second resist pattern is being developed, the first resist pattern may not be developed; therefore, the size of the first resist pattern may not be changed.

Further, in this case, even when it may be required to form the second resist pattern again by a rework process due to alignment displacement or an error, the size of the first pattern may not be changed because different resists are used. For example, in a process where the second resist pattern d again by rework process, after entire surface exposed to expose the second resist, the second resist is removed by developing using a developing fluid for the second resist. Even in this case, the first resist pattern may have a resistance to the developing fluid for the second resist, so that the size of the first resist pattern may not be changed.

Figure 19:
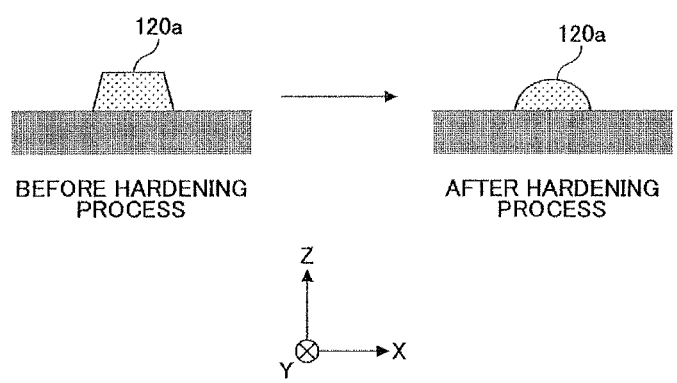
FIG. 19 is a drawing showing a change of a cross-sectional shape of the resist pattern 120a as a result of baking.

On the other hand, when the hardening process is performed on the first resist pattern, a vertical cross-sectional shape of the first resist pattern may be changed into a round shape (see FIG. 19). In a dry etching process, it is known that a tilting angle of the etched side wall is determined depending on an etching selection ratio between the resist and the to-be-etched material. A reason of this change is that not only the to-be-etched material but also the resist may be etched. As a result, the resist pattern is slimmed and the side wall of the to-be-etched material is tilted depending on a result of the slimmed pattern. This tilt determines the vertical cross-sectional shape. When the vertical cross-sectional shape is changed into a round shape, the angle of the etched side wall may vary, which may cause a step disconnection of an electrode wiring.

To resolve this problem, before the hardening process is performed on the first resist pattern, an ultraviolent light (UV-light) may be irradiated onto the laminated body while the laminated body is heated. By doing this way, the surface of the first resist pattern may be hardened, and as a result, deforming the vertical cross-sectional shape into the round shape in the hardening process may be prevented.

Practically, for example, the irradiation of the UV-light may be performed by using the UV dry cleaner (UV-1) (Samco, Inc.). This apparatus is basically used to remove organic matter on the surface of a substrate using UV-light and ozone. However, by introducing nitrogen instead of oxygen, only the effect of the UV-light can be obtained. In this case, the wavelengths of the UV-light are 253.7 nm and 184.9 nm, and the power is 110 W (0.35 $W/cm^2$ because $\phi$ of the lamp is 200 mm). The laminated body is heated at 130° C. and the UV-light is irradiated for five minutes. By doing this, in the hardening process (at 150° C. for five minutes), deforming the vertical cross-sectional shape into the round shape hardening process may be prevented.

In the above embodiment, a case is described where the optical thickness of the dielectric layer 111a is $\lambda/4$. However, the present invention is not limited to this configuration. The present invention may be applied as long as the optical thickness of the dielectric layer 111a is equal to an odd multiple of $\lambda/4$.

In the above embodiment, a case is described where the optical thickness of the dielectric layer 111b is $2\lambda/4$. However, the present invention is not limited to this configuration. The present invention may be applied as long as the optical thickness of the dielectric layer 111b is equal to an even multiple of $\lambda/4$.

Figure 20:
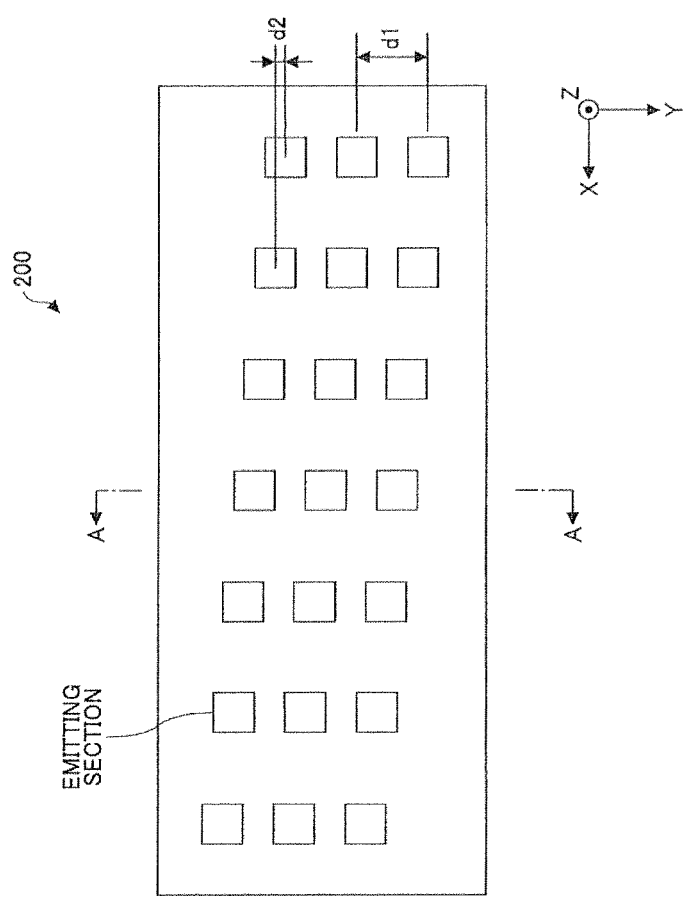
FIG. 20 is a drawing showing a surface emitting laser array.

Further, in the above embodiment, the light source 14 may include, for example, a surface emitting laser array 200 as shown in FIG. 20 instead of using the surface emitting laser 100.

In the surface emitting laser array 200, there are provided two-dimensionally arranged plural (21 in this case) emitting sections formed on the same substrate. In this configuration of FIG. 20, the X axis direction corresponds to the main scanning direction, and the Y axis direction corresponds to the sub scanning direction. The plural emitting sections are arranged in a manner such that when all the emitting sections are orthographically projected on a virtual line extending in the Y axis direction, the distance between the adjacent emitting sections is equal to a constant distance d2. In this description, the distance between the adjacent emitting sections refers to the distance between the centers of adjacent emitting sections. Further, the number of the emitting sections is not necessarily limited to 21.

Figure 21:
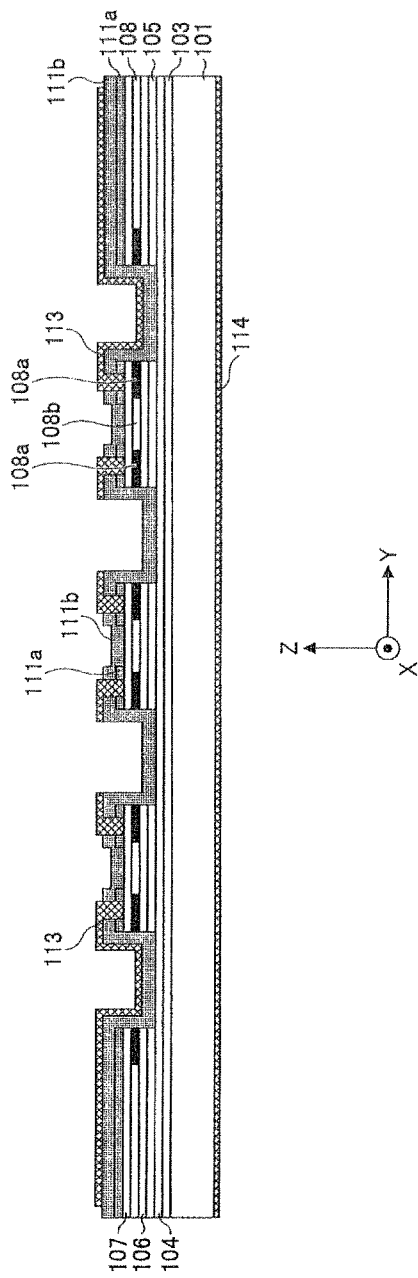
FIG. 21 is a cross-sectional view along line A-A' of FIG. 20.

As shown in FIG. 21, which is a cross-sectional view along A-A line of FIG. 20, each of the emitting sections has a similar configuration to that of the surface emitting laser 100. Further, the surface emitting laser array 200 may be manufactured in a similar manner to that in manufacturing the surface emitting laser 100. Therefore, in each emitting section, when viewed from the Z axis direction, the magnitude (absolute value) of the displacement amount between the centroid of the two low reflection rate regions 121 and the center of the current passage region 108b may be reduced to be equal to or less than 0.1 µm; and the magnitude (absolute value) of the light emitting angle in all the directions may be reduced to be equal to or less than 0.2 degrees. Further, among the emitting sections, it may become possible to obtain plural single fundamental transverse mode laser lights having the same polarization direction. Therefore, twenty-one tiny circular light spots having high light density may be simultaneously formed at respective desired positions on the surface of the photoconductive drum 1030.

Further, in the surface emitting laser array 200, when all the emitting sections are orthographically projected on a virtual line extending in the Y axis direction, the distance between the adjacent emitting sections is equal to a constant distance d2. Because of this configuration, by controlling the turn-on timings of the emitting sections, the configuration of the surface emitting laser array 200 may be regarded as a configuration where the emitting sections are arranged at regular intervals in the sub scanning direction on the photoconductive drum 1030.

Further, for example, when the distance d2 is determined to be 2.65 µm and the magnification of the optical system is determined to be 2 times, high density writing of 4800 dpi (dots per inch) may be achieved. Obviously, for example, by increasing the number of the emitting sections in the main-scanning corresponding direction; by changing the array layout by reducing the pitch d1 in the sub-scanning corresponding direction to further reduce the distance d2; or by reducing magnification of the optical system, the density may be further enhanced, thereby enabling achieving higher quality printing. Further, the writing distance in the main scanning direction may be easily controlled by controlling the turn-on timings of the emitting sections.

Further, in this case, even when the writing dot density is required to be increased, the laser printer 1000 may perform printing without reducing the printing speed. Further, when assuming that writing dot density is to be maintained, the printing speed may be further increased.

Further, preferably, the width of the grooves formed between adjacent emitting sections is equal to or greater than 5 µm to ensure electrical and spatial separations between the emitting sections. When the width is too narrow, it may become difficult to control etching in manufacturing. Further, preferably, the size (side length) of the mesa is equal to or greater than 10 µm. When the size is too small, the heat may not be easily discharged, which may reduce the performance.

Further, in the above embodiment, instead of using the surface emitting laser 100, the surface emitting laser array 200 may be used, having been manufactured in a similar manner to that in manufacturing the surface emitting laser 100 and including the emitting sections arranged in one-dimensional alignment.

Further, in the above embodiment, a case is described where the normal line direction of the main surface of the substrate is inclined 15 degrees. towards A direction of crystal orientation [1 1 1] with respect to the direction of crystal orientation [1 0 0]. However, the present invention is not limited to this situation. When a tilted substrate is used as the substrate, the present invention may be applied as long as the normal line direction of the main surface of the substrate is inclined towards one direction of crystal orientation <1 1 1> with respect to one direction of crystal orientation <1 0 0>.

Further, in above embodiment, a case is described where the substrate is the tilted substrate. However, the present invention is not limited to this configuration.

Further, in the above embodiment, a case is described where the oscillation wavelength emitting section is 780 nm band. However, the present invention is not limited to this configuration. The oscillation wavelength may be changed in accordance with the characteristics of the photoconductive body.

Further, the surface emitting laser 100 and the surface emitting laser array 200 may also be used in applications other than an image forming apparatus.

In such a case, the oscillation wavelength may be, for example, 650 nm band, 850 nm band, 980 nm band, 1.3 µm band, 1.5 µm band or the like. Further, in this case, as the semiconductor material used for the active layer, an appropriate mixed crystal semiconductor material in accordance with the oscillation wavelength may be used. For example, an AlGaInP-based mixed crystal semiconductor material may be used in 650 nm band; an InGaAs-based mixed crystal semiconductor material may be used in 980 nm band; and a GaInNAs(Sb)-based mixed crystal semiconductor material may be used in 1.3 µm band and 1.5 µm band.

Further, by appropriately selecting the material and the configuration reflection mirrors in accordance with the oscillation wavelength to be used, it may become possible to form the emitting section in accordance with any oscillation wavelength. For example, as the mixed crystal other than AlGaAs mixed crystal, AlGaInP mixed crystal or the like may be used. Further, preferably, the low reflection rate region (layer) and the high reflection rate region (layer) may be formed by using materials that are transparent to the oscillation wavelength and that have different reflection rates from each other as much as possible.

In the above embodiment, the laser printer 1000 is described as an image forming apparatus. However, the present invention is not limited to this configuration.

For example, the present invention may also be applied to an image forming apparatus capable of irradiating a laser light onto a medium (such as a sheet) which is capable of forming a color by the laser light.

Further, for example, the present invention may also be applied to an image forming apparatus using a silver-salt film as an image carrier. In this case, a latent image is formed on the silver-salt film by optical scanning, and the latent image may be visualized by a process similar to a developing process performed in a typical silver salt photographic process. Then, the image may be transferred to a printing paper by performing a process similar to the printing process in the typical silver salt photographic process. Such an image forming apparatus may include an optical photoengraving apparatus and an optical drawing apparatus capable of drawing a CT scan image and the like.

Figure 22:
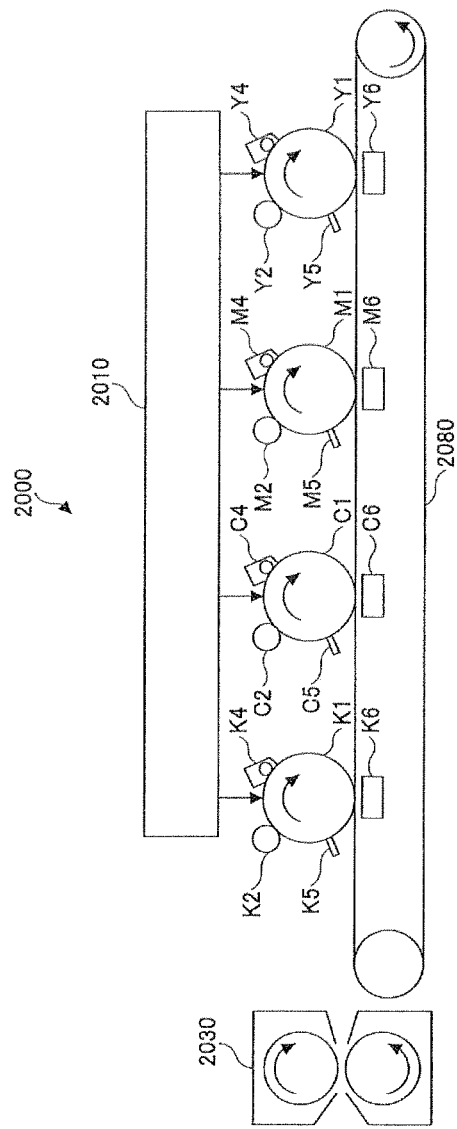
FIG. 22 is a schematic drawing showing a configuration of a color printer.
Figure 23:
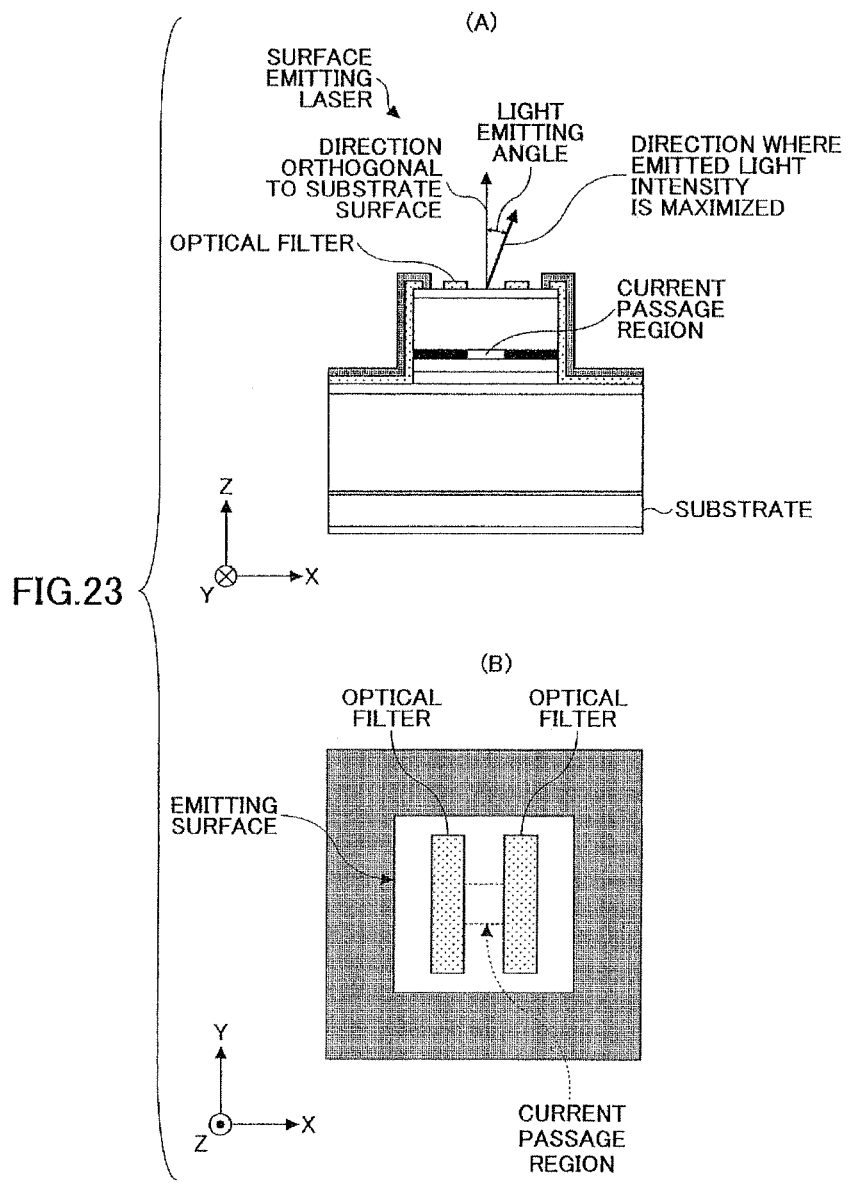
FIG. 23(A) is a drawing illustrating a light emitting angle and optical filters.
FIG. 23(B) is a drawing illustrating the optical filters.
Figure 24:
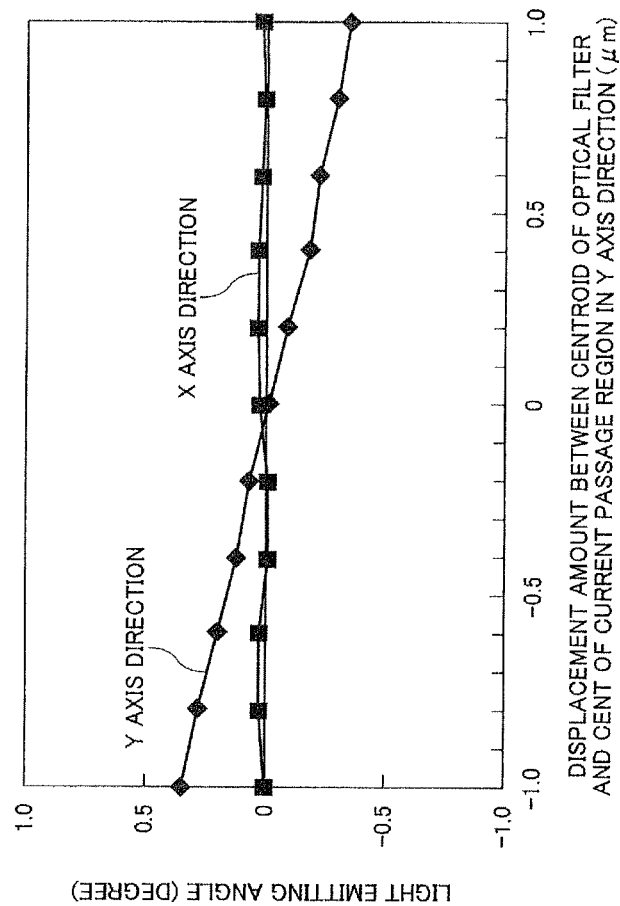
FIG. 24 is a graph illustrating a relationship between a displacement amount of the optical filters in Y axis direction and the light emitting angle.
Figure 25:
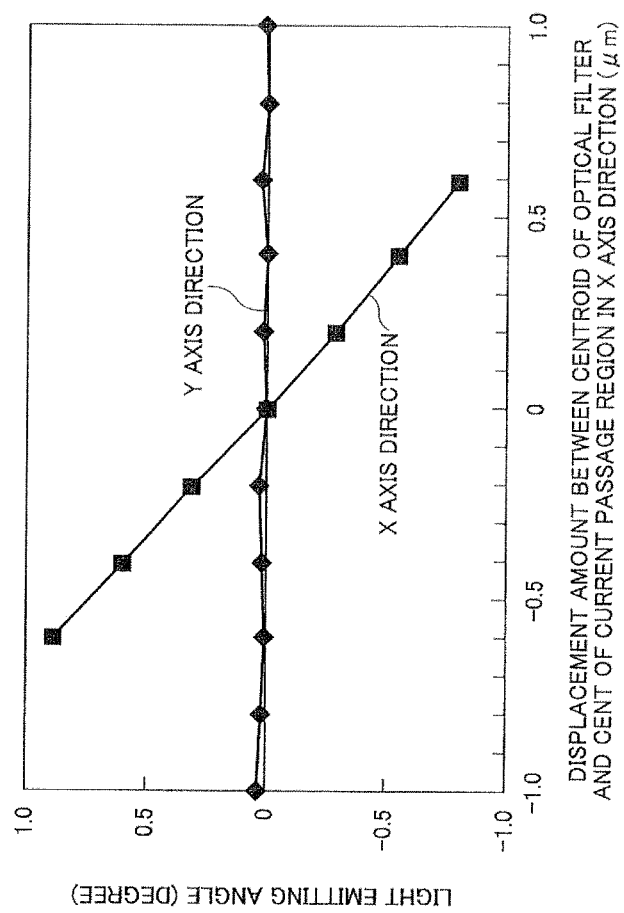
FIG. 25 is a graph illustrating a relationship between a displacement amount of the optical filters in X axis direction and the light emitting angle.

Such an image forming apparatus may further include a color printer 2000 having plural photoconductive drums as shown in FIG. 22.

The color printer 2000 is a tandem-type multi-color printer forming a full-color image by combining four colors (black, cyan, magenta, and yellow). The color printer 2000 includes a station for black (K) (having a photoconductive drum K1, a charger K2, a developing device K4, a cleaning unit K5, and a transfer device K6), a station for cyan (C) having a photoconductive drum C1, a charger C2, a developing device C4, a cleaning unit C5, and a transfer device C6), a station for magenta (M) (having a photoconductive drum M1, a charger M2, a developing device M4, a cleaning unit M5, and a transfer device M6), a station for yellow (Y) (having a photoconductive drum Y1, a charger Y2, a developing device Y4, a cleaning unit Y5, and a transfer device Y6), and an optical scanning device 2010, a transfer belt 2080, a fixing unit 2030 and the like.

The photoconductive drums rotate in the respective arrow directions shown in FIG. 22. In the vicinity of each photoconductive drum, along the rotating direction, there are disposed in order of: the charger, the developing device, the transfer device, and the cleaning unit. The chargers uniformly charge the surface of the respective photoconductive drums. The optical scanning device 2010 irradiates light onto the surfaces of the photoconductive drums to form latent images on the respective photoconductive drums, the surfaces having been charged by the respective chargers. Then, colored toner images are formed on the surfaces of the photoconductive drums by the respective developing devices. Further, the colored toner images are superposed onto the recording paper on the transfer belt 2080 by the respective transfer devices. Finally, the superposed colored image is fixed to the recording paper by the fixing unit 2030.

The optical scanning device 2010 includes light sources having either a surface emitting laser or a surface emitting laser array manufactured by a method similar to that of the surface emitting laser 100. Because of this feature, the optical scanning device 2010 may achieve the same effect as that achieved by the optical scanning device 1010. Further, the color printer 2000 includes the optical scanning device 2010; therefore, the color printer may achieve the same effect as that achieved by the laser printer 1000.

Further, in the color printer 2000, a color displacement may occur due to manufacturing error or positional error of used parts or the like. Even in such a case, when the light sources of the optical scanning device 2010 have the surface emitting laser array similar to the surface emitting laser array 200, the color displacement may be better controller by selecting the emitting section to be turned ON.

INDUSTRIAL APPLICABILITY

As described above, a method of manufacturing a surface emitting laser according to an embodiment of the present invention may be appropriate to stably manufacturing a surface emitting laser having the magnitude (absolute value) of displacement amount equal to or less than 0.1 μm while better controlling the transverse-mode oscillation. Further, in a surface emitting laser and a surface emitting laser array according to an embodiment of the present invention, it may be adequate to reduce the magnitude (absolute value) of the light emitting angle to be equal to or less than 0.2 degrees while better controlling the transverse-mode oscillation without incurring high cost. Further, an image forming apparatus according to an embodiment of the present invention may be appropriate to forming a high-quality image without incurring high cost.

The present application is based on and claims the benefit of priority of Japanese Patent Application Nos. 2009-128134 filed on May 28, 2009 and 2010-009820 filed on Jan. 20, 2010, the entire contents of which are hereby incorporated herein by reference.

The invention claimed is:

1. A method of manufacturing a surface emitting laser, the surface emitting laser including:
   a laminated body in which a lower reflection mirror, a resonance structure, and an upper reflection mirror are laminated on a substrate, the resonance structure including an active layer, the upper reflection mirror including a selectively-oxidized layer, and
   a mesa structure formed in the laminated body and providing an emitting section, the emitting section including a current confined structure and an emitting region, the current confined structure including an oxide surrounding a current passage region, the emitting region including a relatively high reflection rate part and a relatively low reflection rate part, the method comprising:
   a first dielectric layer laminating step of laminating a first transparent dielectric layer on an upper surface of the laminated body; and
   a resist pattern forming step of forming first and second resist patterns simultaneously on an upper surface of the first transparent dielectric layer,
   wherein the first resist pattern includes a pattern configured to define an outer perimeter of the mesa structure and a pattern configured to protect a region corresponding to one of the relatively high reflection rate part and the relatively low reflection rate part included in the emitting region, and
   wherein the second resist pattern is configured to protect a region corresponding to all of the emitting region,
   wherein the first dielectric layer laminating step and the resist pattern forming step are performed before the mesa structure is formed.

2. The method of manufacturing a surface emitting laser according to claim 1, further comprising:
   a second dielectric layer laminating step of, after the current confined structure is formed, laminating a second transparent dielectric layer on an upper surface of the laminated body, the second transparent dielectric layer having an optical thickness of either an even multiple of (oscillation wavelength/4) or (oscillation wavelength/4)+(and even multiple of (oscillation wavelength/4),
   wherein, in the first dielectric layer laminating step, the first transparent dielectric layer having an optical thickness of an odd multiple of (oscillation wavelength/4) is laminated.

3. The method of manufacturing a surface emitting laser according to claim 2,
   wherein a material of the first dielectric layer is a same as a material of the second dielectric layer.

4. The method of manufacturing a surface emitting laser according to claim 2,
   wherein a material of the first dielectric layer is different from a material of the second dielectric layer.

* * * * *